US012684817B2

(12) United States Patent     (10) Patent No.:   US 12,684,817 B2

Fan et al.       (45) Date of Patent:     Jul. 14, 2026

(54) SPACER CUT FOR ASYMMETRIC SOURCE/DRAIN EPITAXIAL STRUCTURE IN STACKED FET

(71) Applicant: INTERNATIONAL BUSINESS MACHINES CORPORATION, Armonk, NY (US)

(72) Inventors: Su Chen Fan, Cohoes, NY (US); Albert M. Young, Fishkill, NY (US); Ruilong Xie, Niskayuna, NY (US); Prabudhya Roy Chowdhury, Albany, NY (US); Jay William Strane, Warwick, NY (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 18/054,958

(22) Filed: Nov. 14, 2022

(65) Prior Publication Data

US 2024/0162319 A1     May 16, 2024

(51) Int. Cl.
| | |
|---|---|
| *H10D 30/67* | (2025.01) |
| *H10D 62/10* | (2025.01) |
| *H10D 64/01* | (2025.01) |
| *H10D 84/83* | (2025.01) |
| *H10D 84/85* | (2025.01) |

(52) U.S. Cl.
CPC ..... *H10D 30/6735* (2025.01); *H10D 30/6757* (2025.01); *H10D 62/121* (2025.01); *H10D 64/017* (2025.01); *H10D 84/8312* (2025.01); *H10D 84/856* (2025.01)

(58) Field of Classification Search
CPC .............. H10D 30/6717; H10D 30/019; H10D 30/501; H10D 30/0221; H10D 30/603;

H10D 30/6735; H10D 30/6757; H10D 62/121; H10D 64/017; H10D 62/151; H10D 62/149; H10D 62/021; H10D 62/155; H10D 62/159; H10D 84/017; H10D 30/502;
(Continued)

(56) References Cited

U.S. PATENT DOCUMENTS

| | | | |
|---|---|---|---|
| 10,192,819 B1 * | 1/2019 | Chanemougame | .... H10D 30/43 |
| 10,879,308 B1 | 12/2020 | Ando et al. | |

(Continued)

FOREIGN PATENT DOCUMENTS

| | | | | |
|---|---|---|---|---|
| CN | 1510756 A | * | 7/2004 | ....... H01L 21/26533 |
| CN | 103715064 A | * | 4/2014 | ........ H01L 21/31111 |

OTHER PUBLICATIONS

Chau Robert et al., "Process and Packaging Innovations for Moore's Law Continuation and Beyond", 2019 IEEE International Electron Devices Meeting (IEDM), Dec. 7-11, 2019, 06 pages, DOI: 10.1109/IEDM19573.2019.8993462.

(Continued)

*Primary Examiner* — Julio J Maldonado
*Assistant Examiner* — Nathan Pridemore
(74) *Attorney, Agent, or Firm* — CANTOR COLBURN LLP; Samuel Waldbaum

(57) ABSTRACT

Embodiments of the invention include a stacked device having a first epitaxial region and a second epitaxial region vertically displaced from the first epitaxial region. The first epitaxial region comprising an asymmetric profile with a horizontal protrusion. A contact is formed on the horizontal protrusion of the first epitaxial region

19 Claims, 29 Drawing Sheets

(58) Field of Classification Search
CPC ............. H10D 64/251; H10D 84/8312; H10D
84/856; H01L 25/074; H01L 25/117
See application file for complete search history.

(56) References Cited

U.S. PATENT DOCUMENTS

| | | | |
|---|---|---|---|
| 11,063,045 B2 | 7/2021 | Wu et al. | |
| 11,251,308 B2 | 2/2022 | Liao et al. | |
| 2019/0288065 A1* | 9/2019 | Cho ....................... | H10B 10/12 |
| 2020/0075574 A1 | 3/2020 | Smith et al. | |
| 2020/0098754 A1* | 3/2020 | Pillarisetty .......... | H10D 84/038 |
| 2020/0098859 A1* | 3/2020 | Reboh .................. | H10D 84/834 |
| 2020/0118886 A1* | 4/2020 | Miao .................... | H10D 64/017 |
| 2021/0320035 A1* | 10/2021 | Xie ...................... | H10D 62/118 |
| 2021/0336019 A1 | 10/2021 | Su et al. | |
| 2021/0349691 A1* | 11/2021 | Hekmatshoartabari ...................... | H10D 30/6713 |
| 2021/0366907 A1* | 11/2021 | Liao ................... | H10D 84/8311 |
| 2022/0037193 A1 | 2/2022 | Yu et al. | |

OTHER PUBLICATIONS

Huang et al., "3-D Self-aligned Stacked NMOS-on-PMOS Nanorib-bon Transistors for Continued Moore's Law Scaling", 2020 IEEE International Electron Devices Meeting (IEDM), Dec. 12-18, 2020, 04 pages, DOI: 10.1109/IEDM13553.2020.9372066.

\* cited by examiner

TOP ACTIVE AREA

GATE

BOTTOM ACTIVE AREA 112
110
112
110
112
110
114
110
112
110
112
110

122
120

102

150

GATE

TOP ACTIVE AREA

BOTTOM ACTIVE AREA

100

302

112
110
112
110
112
110
302
110
112
110
112
110

150

GATE

TOP ACTIVE AREA

BOTTOM ACTIVE AREA

X

Y

122

120

102

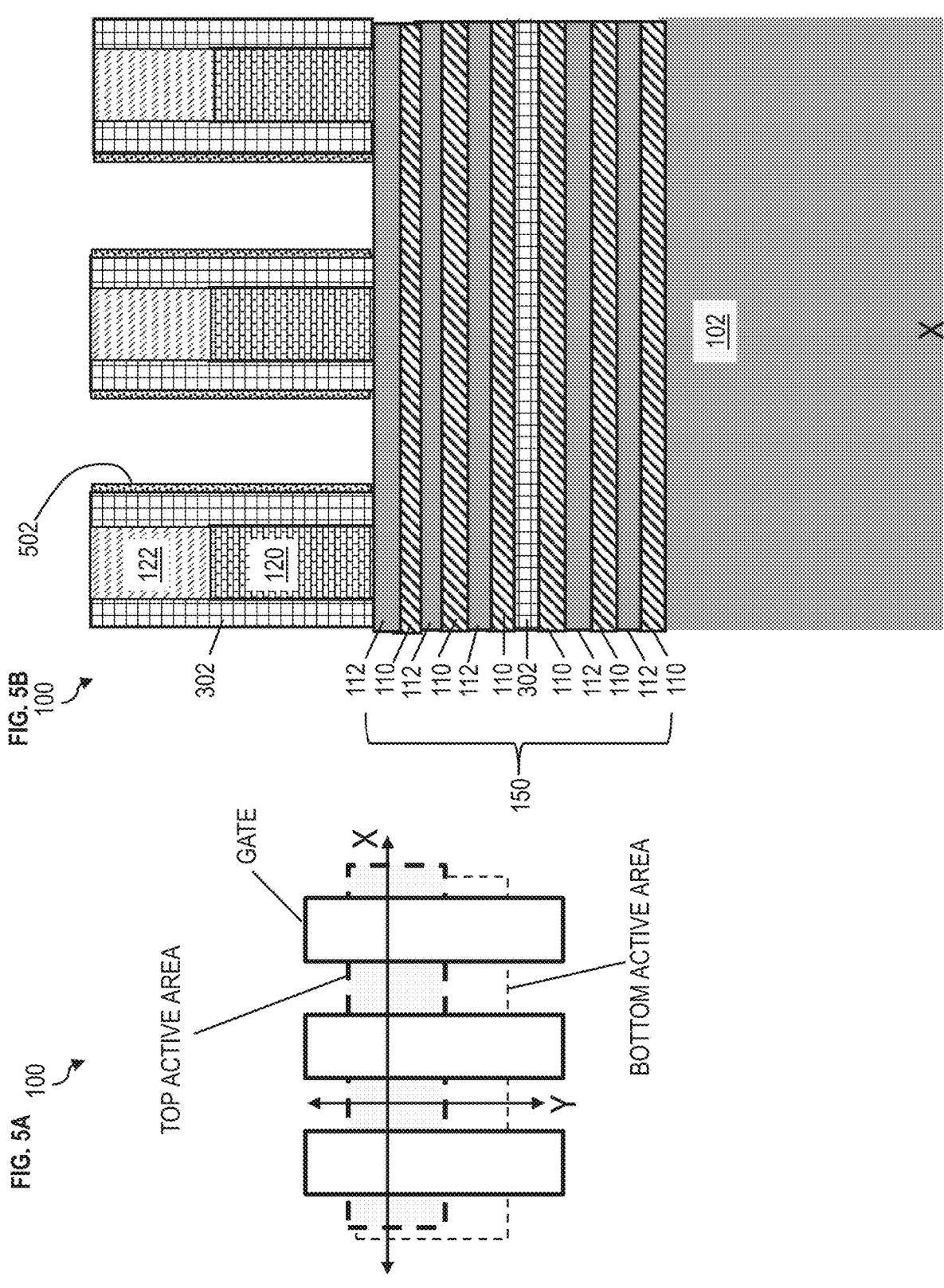

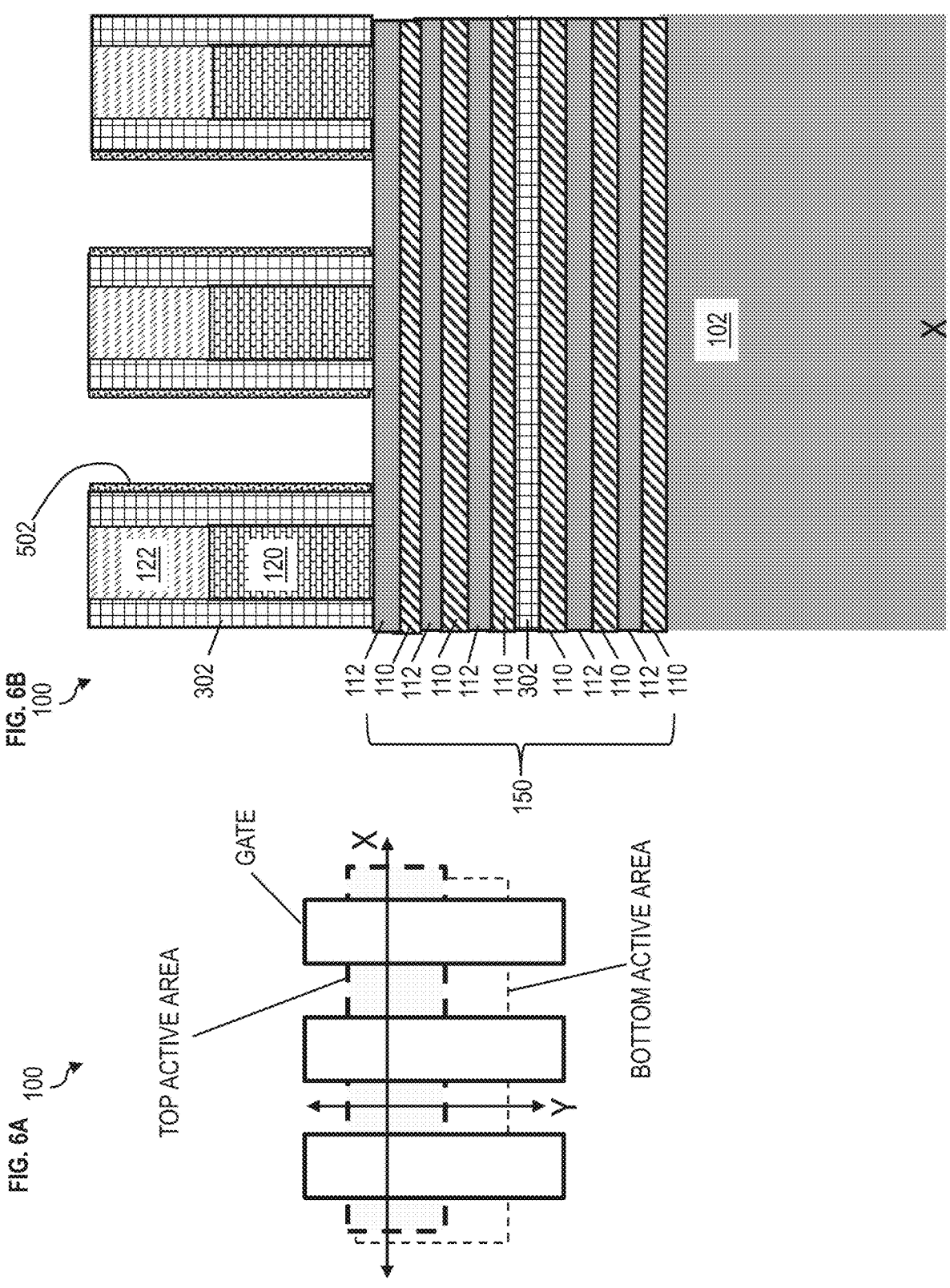

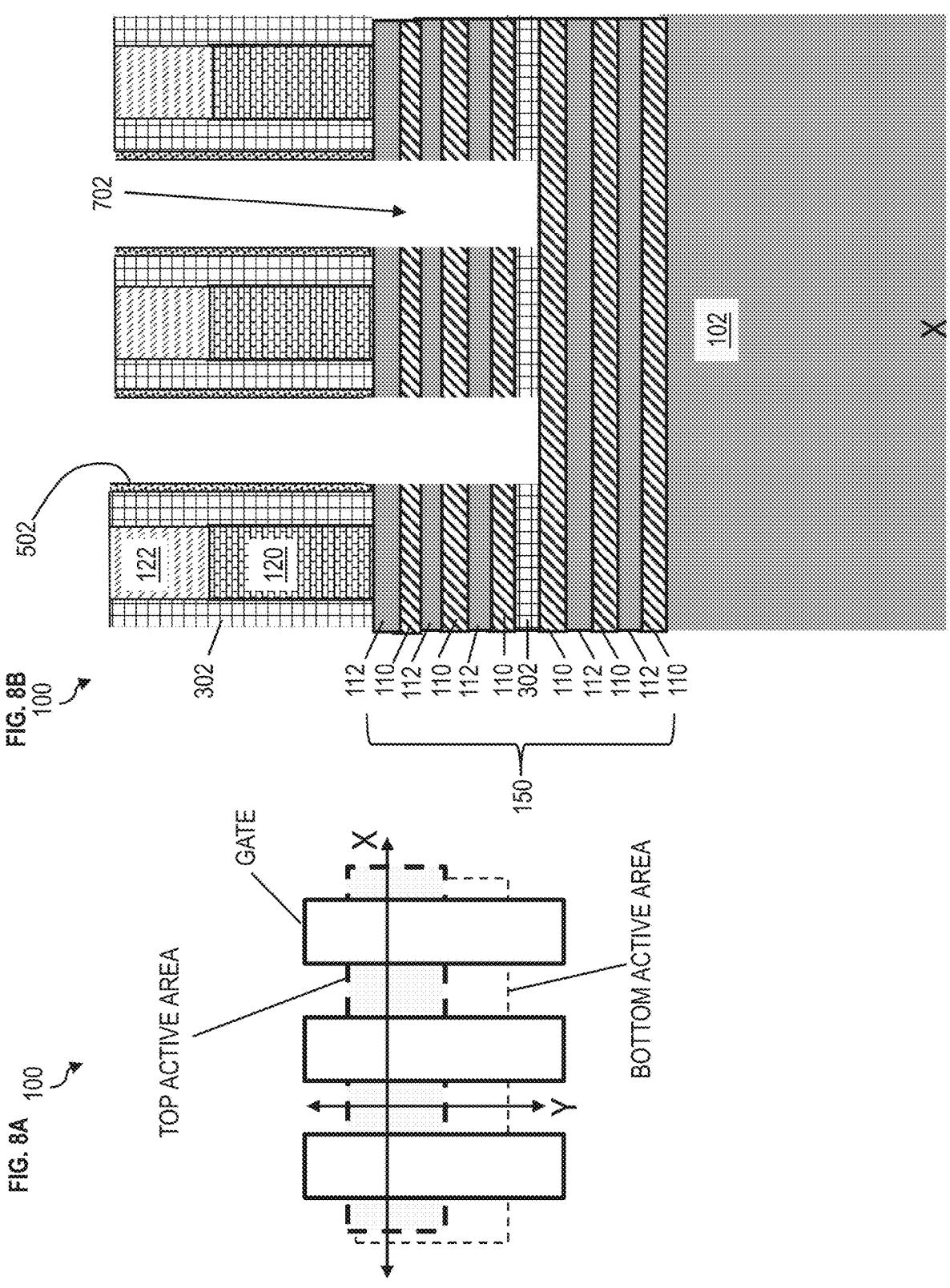

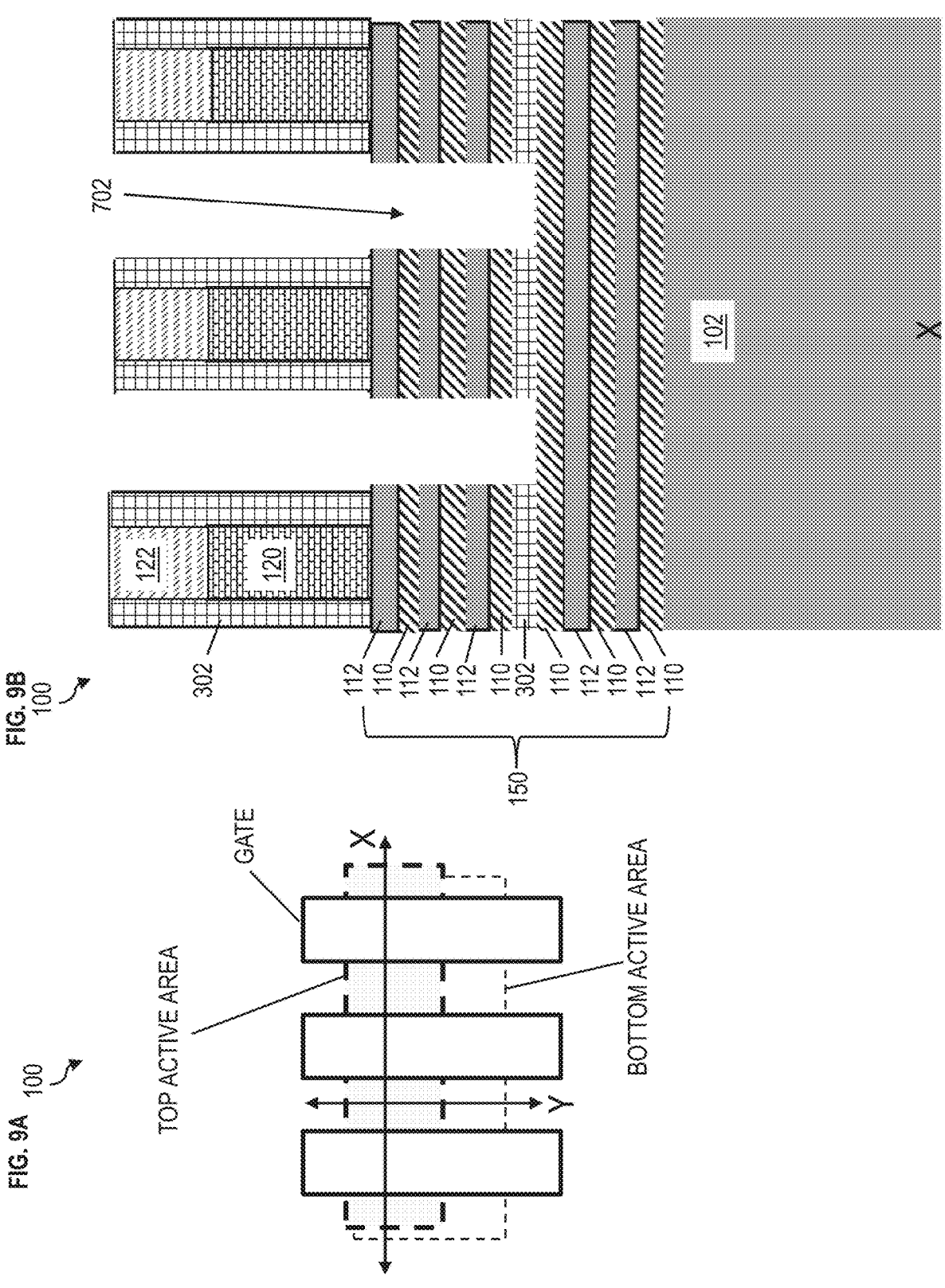

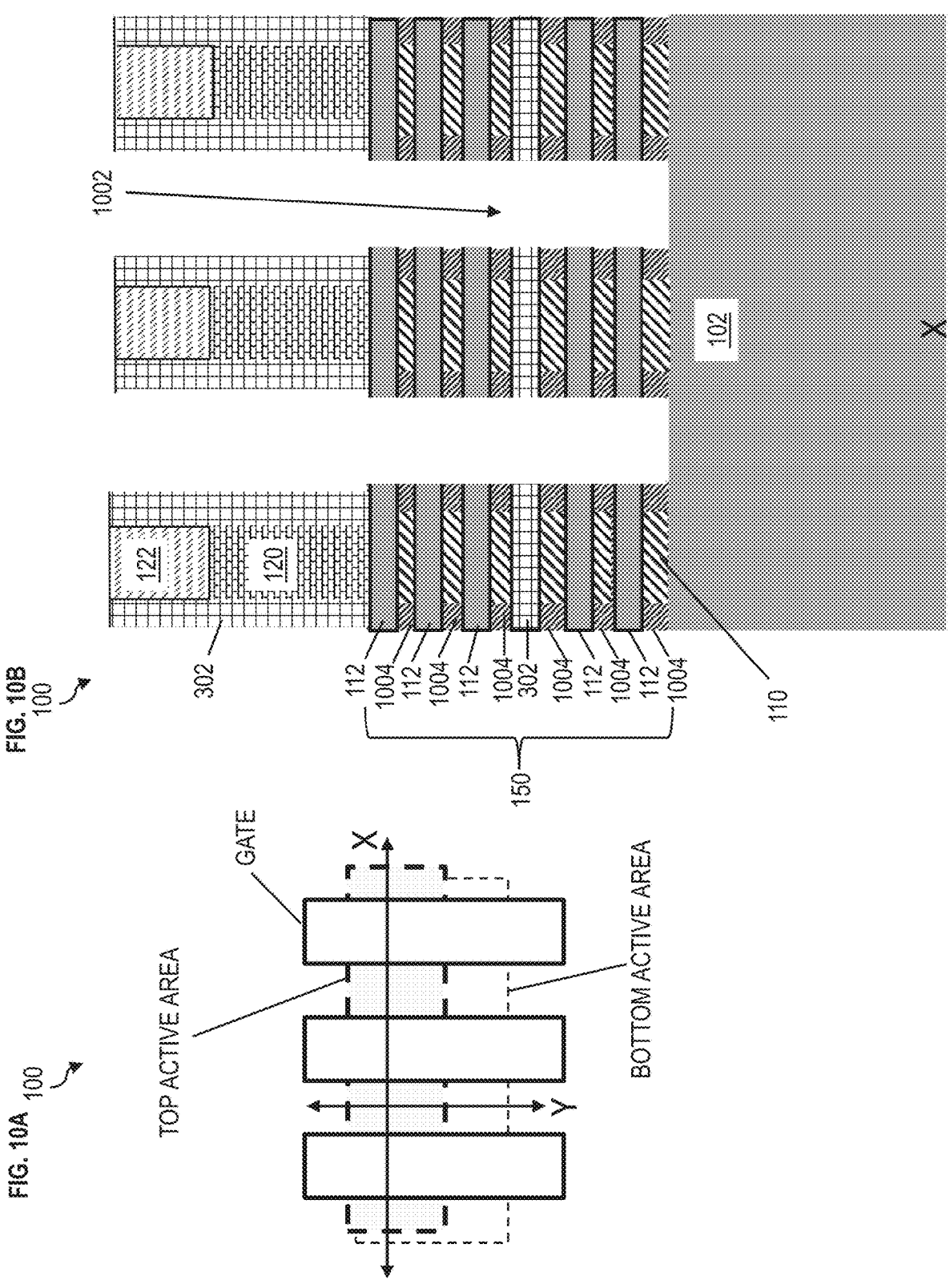

1500

PROVIDE A FIRST EPITAXIAL REGION AND A SECOND EPITAXIAL REGION VERTICALLY DISPLACED FROM THE FIRST EPITAXIAL REGION, THE FIRST EPITAXIAL REGION COMPRISING AN ASYMMETRIC PROFILE WITH A HORIZONTAL PROTRUSION   1502

FORM A CONTACT ON THE HORIZONTAL PROTRUSION OF THE FIRST EPITAXIAL REGION   1504

SPACER CUT FOR ASYMMETRIC SOURCE/DRAIN EPITAXIAL STRUCTURE IN STACKED FET

BACKGROUND

The present invention generally relates to fabrication methods and resulting structures for integrated circuits (ICs), and more specifically, to fabrication methods and resulting structures configured and arranged to provide a spacer cut for an asymmetric source/drain epitaxial structure in a stacked field-effect transistor (FET).

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., formed in layers of the IC and interconnected with wiring in the back-end-of-line (BEOL) layers of the wafer. on the wafer. Typical ICs are formed by first fabricating individual semiconductor devices using processes referred to generally as the front-end-of-line (FEOL). A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes a plurality of vertically spaced-apart sheets of semiconductor material. A gate structure for the device is positioned around each of these spaced-apart layers of channel semiconductor material.

One example of a complex gate-all-around technology is a complementary-FET, which is a 3D monolithic structure having N-type FET (NFET) and P-type FET (PFET) nanowires/nanosheets vertically stacked on top of each other. A complementary-FET layout typically has P-type FETs on one level and N-type FETs on an adjacent level (i.e., above or below). In such structures, the source/drain regions of the lower FET are electrically isolated from the source/drain regions of the upper FET by dielectric layers. Thereafter, the BEOL is the second portion of IC fabrication where wiring of the IC is formed. The BEOL layer that includes the interconnection of wiring is referred to as the metallization layer, which generally begins when the first layer of metal is deposited on the wafer. BEOL layers of the IC generally include contacts, insulating layers (dielectrics), metal levels, bonding sites for chip-to-package connections, etc. ICs typically have interconnect levels, each level consisting of metallic lines (or tracks) and vias. Although methods and resulting stacked FETs are suitable for their intended purposes, one or more embodiments provide spacing improvements.

SUMMARY

Embodiments of the present invention are directed to providing fabrication methods and resulting structures for a fang spacer cut for an asymmetric source/drain epitaxial structure in a stacked FET. A non-limiting method includes providing a first epitaxial region and a second epitaxial region vertically displaced from the first epitaxial region, the first epitaxial region comprising an asymmetric profile with a horizontal protrusion. The method includes forming a contact on the horizontal protrusion of the first epitaxial region.

This can provide an improvement over known methods for stacked FET devices by providing bottom source/drain epitaxial regions where one side or both sides are not confined by fang spacers. This asymmetric or symmetric bottom source/drain epitaxial region with extended horizontal protrusions provides a surface that is available for contacts, such that the contacts avoid reaching any substrate material underneath. Additionally, by having contacts formed on the horizontal protrusion, there is a wider tip-to-tip room between top source/drain contacts and bottom source/drain contacts.

In addition to one or more of the features described above or below, or as an alternative, further embodiments of the invention disclose wherein a stack comprises the first epitaxial region and the second epitaxial region. This advantageously allows for wider tip-to-tip room between top source/drain contacts and bottom source/drain contacts by forming the bottom source/drain contacts on the extended horizontal protrusions.

In addition to one or more of the features described above or below, or as an alternative, further embodiments of the invention disclose wherein a first transistor comprises the first epitaxial region and a second transistor comprises the second epitaxial region, the first and second transistors being vertically stacked. This advantageously allows for wider tip-to-tip room between top source/drain contacts and bottom source/drain contacts by forming the bottom source/drain contacts on the extended horizontal protrusions.

In addition to one or more of the features described above or below, or as an alternative, further embodiments of the invention disclose wherein spacer material confines one side of the first epitaxial region, the horizontal protrusion being opposite the one side and free of confinement by the spacer material. This advantageously results in the horizontal protrusion and allows for wider tip-to-tip room between top source/drain contacts and bottom source/drain contacts by forming the bottom source/drain contacts on the extended horizontal protrusions.

In addition to one or more of the features described above or below, or as an alternative, further embodiments of the invention disclose wherein one side of the first epitaxial region is flat and is opposite the horizontal protrusion. This advantageously allows for wider tip-to-tip room between top source/drain contacts and bottom source/drain contacts by forming the bottom source/drain contacts on the extended horizontal protrusions.

In addition to one or more of the features described above or below, or as an alternative, further embodiments of the invention disclose wherein the contact formed on the horizontal protrusion of the first epitaxial region is physically and laterally separated by another contact formed on the second epitaxial region. This advantageously allows for wider tip-to-tip room between top source/drain contacts and bottom source/drain contacts by forming the bottom source/drain contacts on the extended horizontal protrusions.

In addition to one or more of the features described above or below, or as an alternative, further embodiments of the invention disclose wherein the horizontal protrusion extends beyond an edge of the second epitaxial region. This advantageously allows for wider tip-to-tip room between top source/drain contacts and bottom source/drain contacts by forming the bottom source/drain contacts on the extended horizontal protrusions.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 5A, 5B, and 5C respectively depict a top view and cross-sectional views of a portion of an IC under-fabrication after fabrication operations according to one or more embodiments of the invention;

FIGS. 6A, 6B, and 6C respectively depict a top view and cross-sectional views of a portion of an IC under-fabrication after fabrication operations according to one or more embodiments of the invention;

FIGS. 8A, 8B, and 8C respectively depict a top view and cross-sectional views of a portion of an IC under-fabrication after fabrication operations according to one or more embodiments of the invention;

FIGS. 9A, 9B, and 9C respectively depict a top view and cross-sectional views of a portion of an IC under-fabrication after fabrication operations according to one or more embodiments of the invention;

FIGS. 10A, 10B, and 10C respectively depict a top view and cross-sectional views of a portion of an IC under-fabrication after fabrication operations according to one or more embodiments of the invention;

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

One or more embodiments provide fabrication methods and resulting structures for a fang spacer cut for an asymmetric source/drain epitaxial structure in a stacked field-effect transistor (FET). A semiconductor device includes top source/drain epitaxial regions for a top FET and bottom source/drain epitaxial regions for a bottom FET. The bottom source/drain epitaxial regions can be formed with a fang spacer on one side, such that the opposite side without the fang spacer epitaxially grows with a horizontal protrusion in a horizontal direction parallel to the substrate. Because the fang spacer is absent, the horizontal protrusion growth is unconfined. Accordingly, the bottom source/drain epitaxial region has an asymmetric profile or shape because of the horizontal protrusion on one side but not the other side. A metal contact lands on the horizontal protrusion of the asymmetric bottom source/drain epitaxial region. An adjacent metal contact lands on the top source/drain epitaxial region. The tip-to-tip distance is increased between the metal contact for the asymmetric bottom source/drain epitaxial region and the adjacent metal contact for the top source/drain epitaxial region, because of the horizontal protrusion, thereby preventing a short circuit.

Figures 1A, 1B:
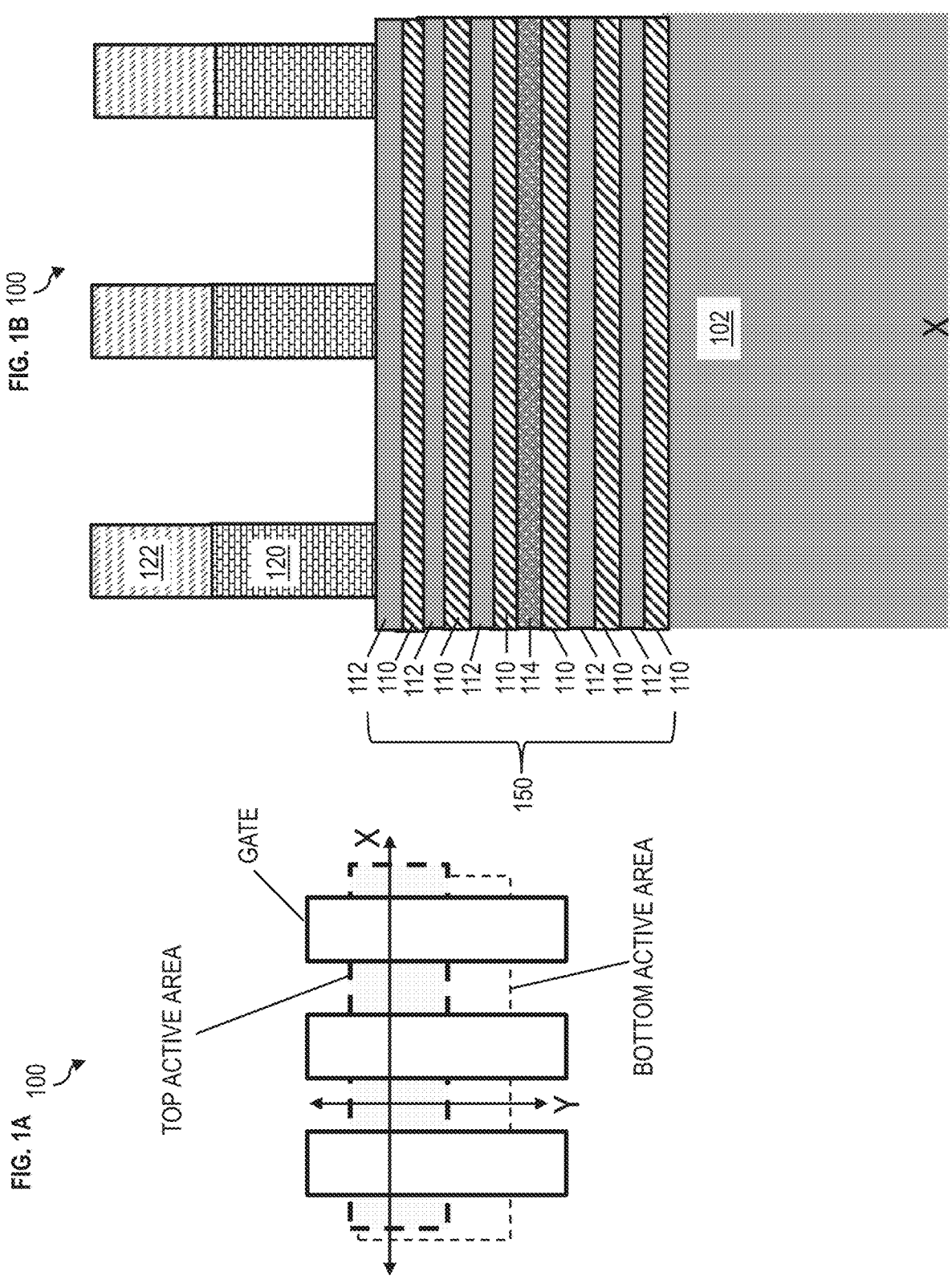
FIGS. 1A, 1B, and 1C respectively depict a top view and cross-sectional views of a portion of an integrated circuit (IC) under-fabrication after fabrication operations according to one or more embodiments of the invention.
Figure 1C:
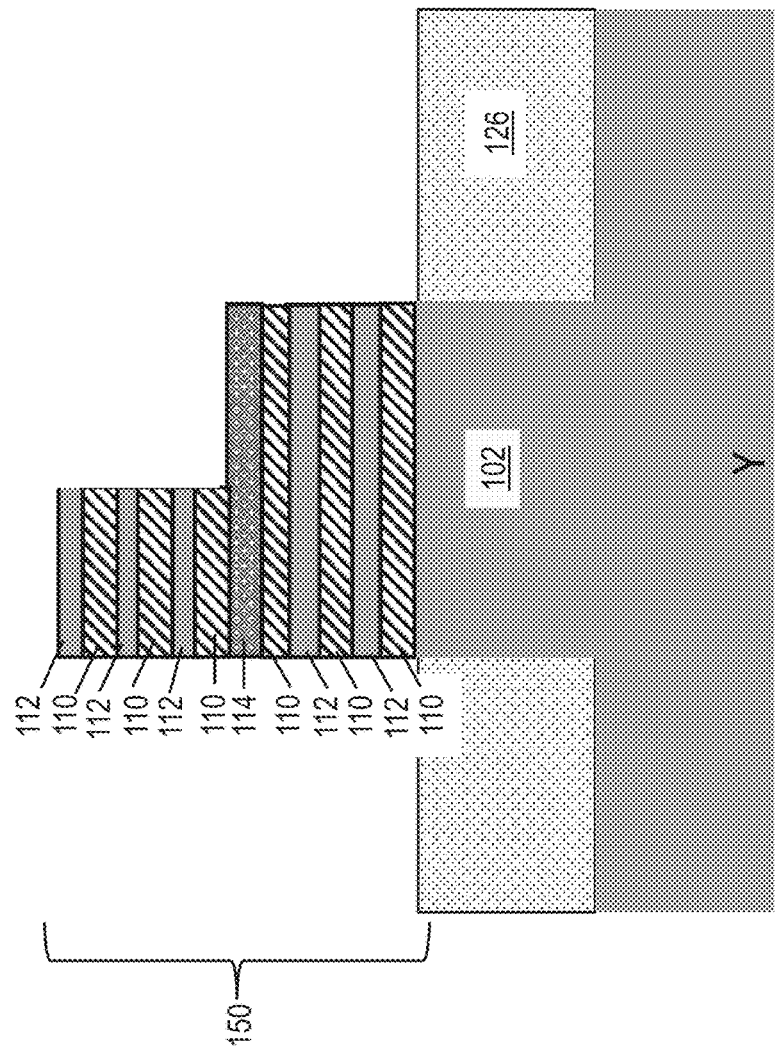

Turning now to a more detailed description of aspects of the present invention, FIG. 1A depicts a top view of a simplified illustration of a portion of an integrated circuit (IC) 100, FIG. 1B depicts a cross-sectional view taken along X of the IC 100, and FIG. 1C depicts a cross-sectional view taken along Y of the IC 100. For ease of understanding, some layers may be omitted from the various top views so as not to obscure the figure and to view layers underneath. As such, the top view is intended to provide a simplified illustration and a general orientation. Standard semiconductor fabrication techniques can be utilized to fabricate IC 100 as understood by one of ordinary skill in the art. Any suitable lithography processes including deposition techniques and etching techniques can be utilized herein.

FIGS. 1A, 1B, and 1C depict the IC 100 starting with a wafer where several fabrication processes have been performed. A nanosheet stack 150 is formed. The nanosheet stack 150 is formed on a substrate 102. The wafer or substrate 102 may be formed of silicon. Other suitable materials can be utilized for the substrates 102.

Initially, the nanosheet stack 150 includes layer 114 formed in between two layers 110. The nanosheet stack 150 includes alternating layers 110 and 112 formed above and below layer 114. The layers 112 are semiconductor material and may be substantially pure silicon. The layers 112 are to be utilized as the channel regions for the FET devices. The layers 110 are sacrificial layers formed of silicon germanium (SiGe) where germanium has an atomic percent (%) of about 30%, thereby leaving silicon with an atomic percent of about 70%. In layers 110, the atomic percent of germanium may range from about 20-35%, while silicon is the remainder. The layer 114 (which is a placeholder for the spacer material) is a sacrificial layer formed of silicon germanium, where the atomic percent of germanium is about 55%. In layer 114, the atomic percent of germanium may range from about 50-65%, while silicon is the remainder. In one or more embodiments, the thicknesses of semiconductor layers 110, 112, 114 may be about the same. In one or more embodiments, the thicknesses of the semiconductor layers 110, 112, 114 may vary depending upon the particular application and they need not have the same thicknesses.

A portion of the nanosheet stack 150 is etched as best seen in FIG. 1C. Shallow trench isolation (STI) regions 126 are formed in the substrate 102. The STI regions 126 may include one or more dielectric materials such as $SiO_2$. The STI regions 126 may include a low-k or ultralow-k dielectric material.

Using a patterned hard mask layer 122, sacrificial gate structures 120, also referred to as dummy gates, are formed on the nanosheet stacks 150. The sacrificial gate structures 120 are sacrificial in nature in that they are replaced at a later point in the process flow with other materials to form functional gate structures, as described below. Sacrificial gate structures 120 may include one or more layers of material, such as a sacrificial gate insulation layer (e.g., silicon dioxide) and/or a sacrificial gate material (e.g., amorphous silicon) which are not separately shown.

Figures 2A, 2B:
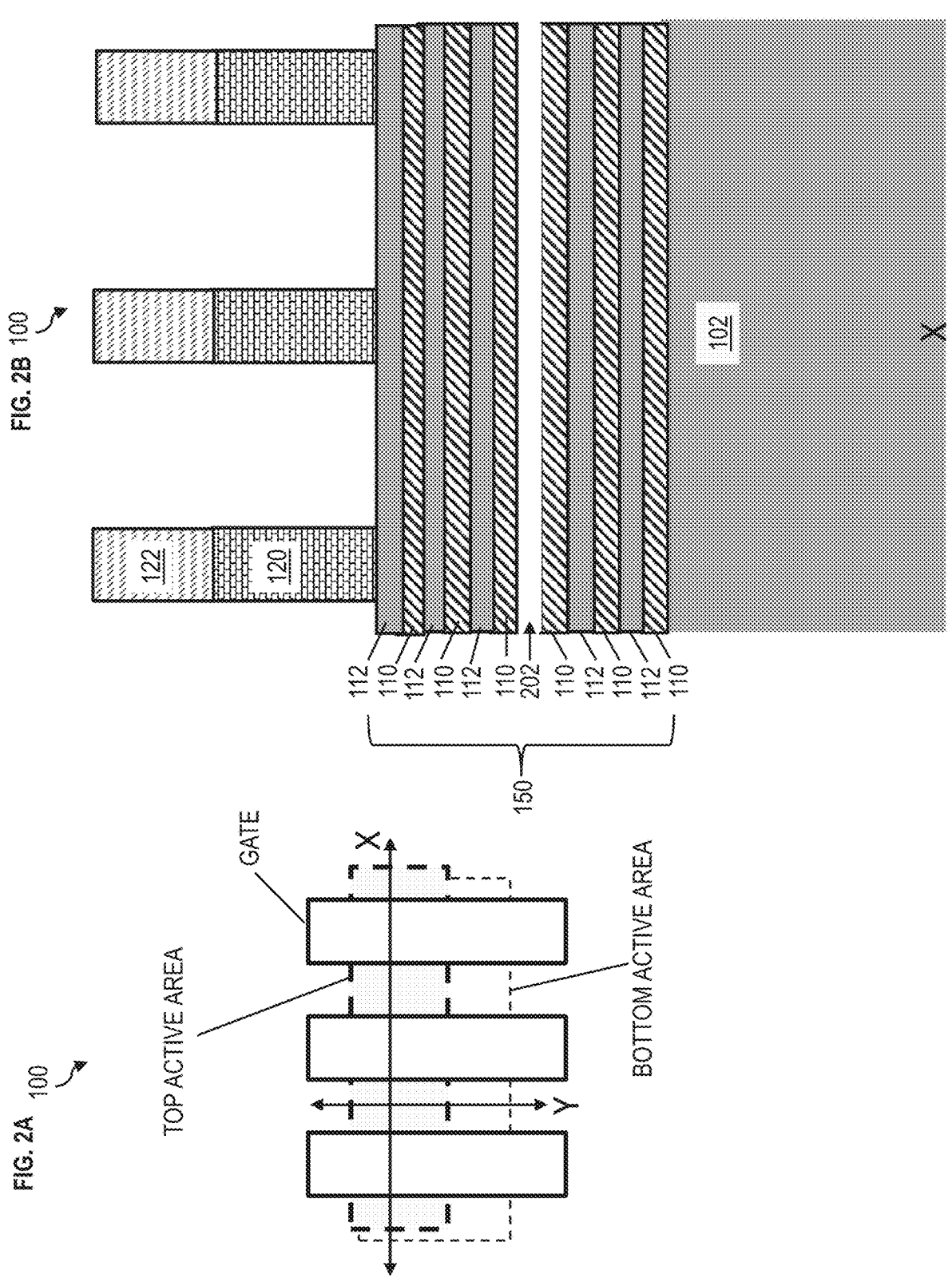
FIGS. 2A, 2B, and 2C respectively depict a top view and cross-sectional views of a portion of an IC under-fabrication after fabrication operations according to one or more embodiments of the invention.
Figure 2C:
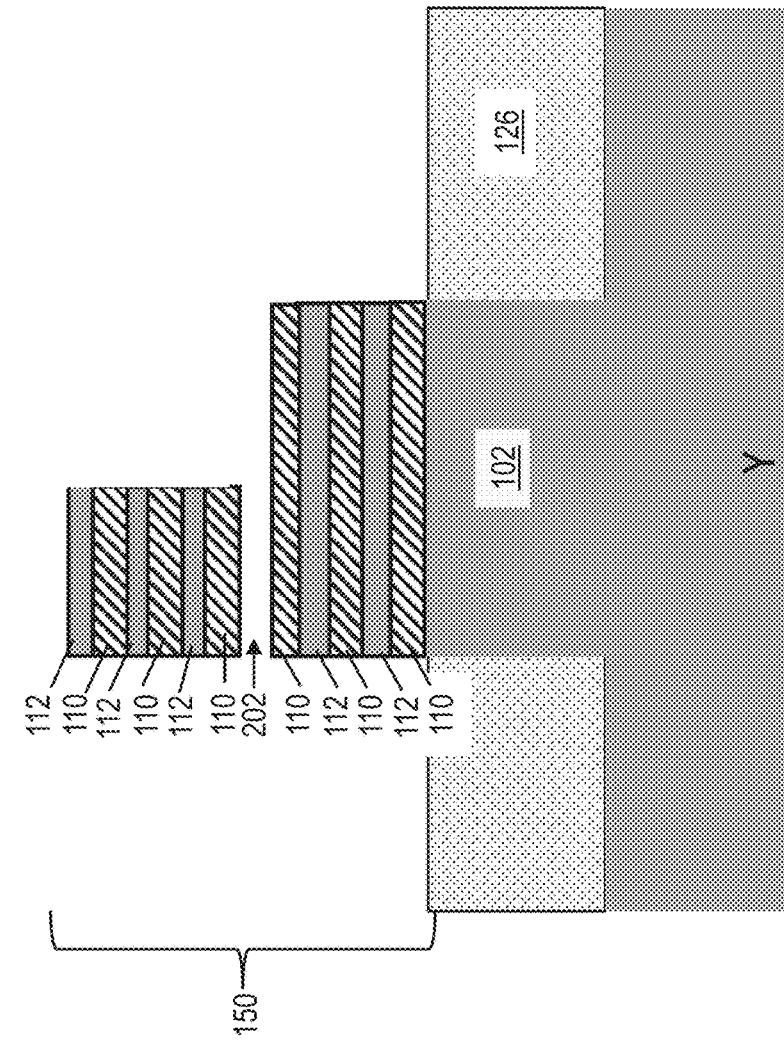
Figures 3A, 3B:
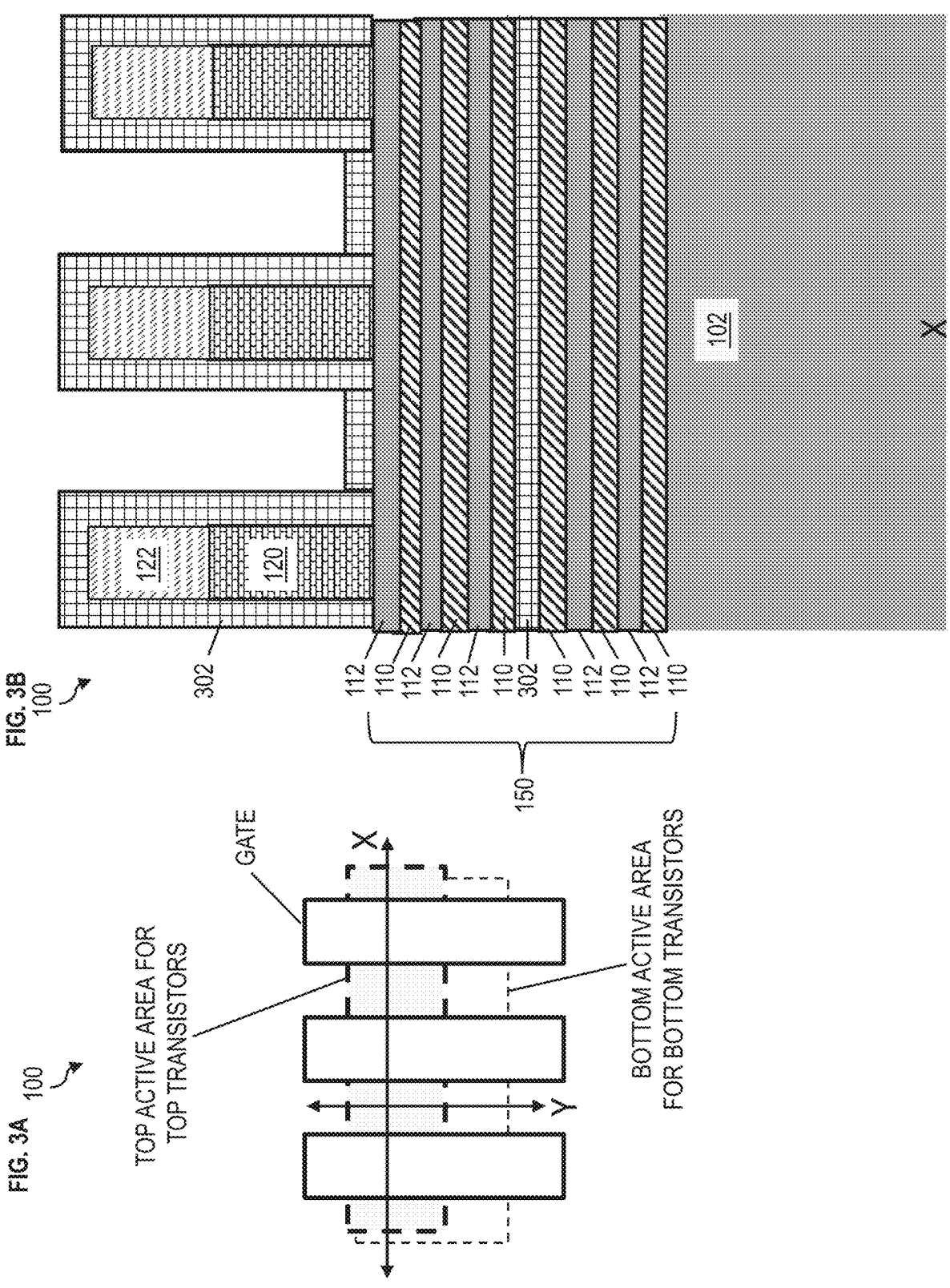
FIGS. 3A, 3B, and 3C respectively depict a top view and cross-sectional views of a portion of an IC under-fabrication after fabrication operations according to one or more embodiments of the invention.
Figure 3C:
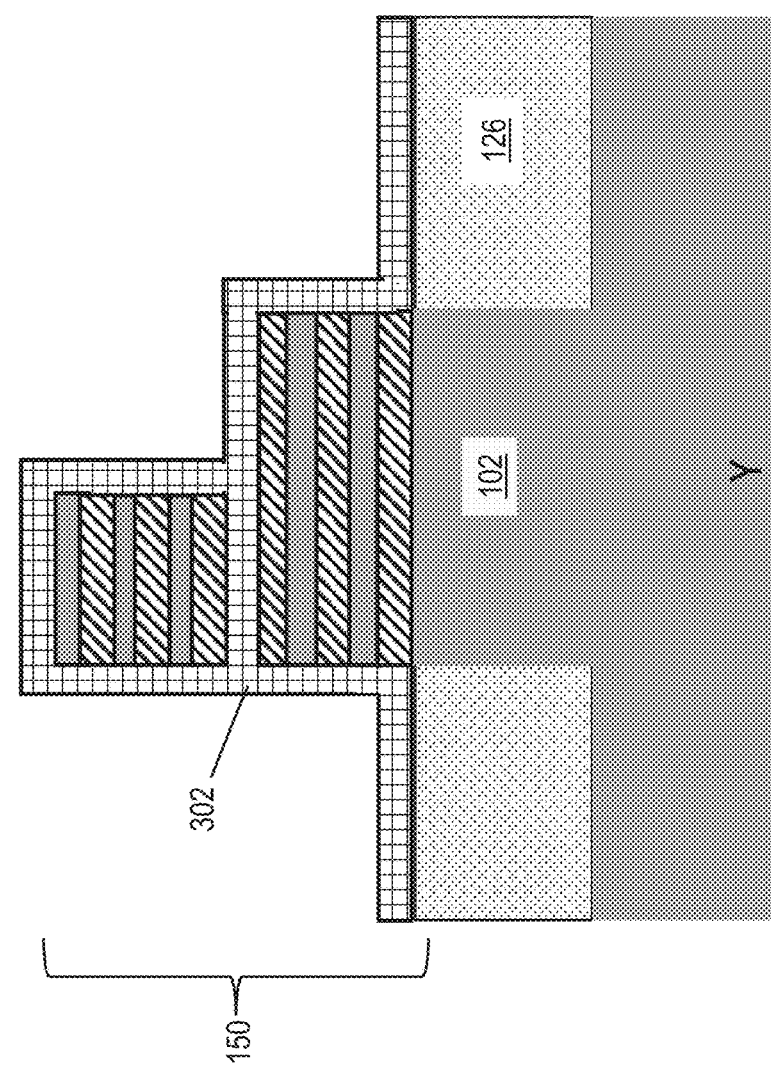

FIGS. 2A, 2B, and 3C depict the IC 100 after removal of sacrificial layer 114. A selective etch is performed to remove sacrificial layer 114. For example, an isotropic etch may be performed to remove sacrificial layer 114 while not removing layers 110 and 112, thereby creating cavity 202. An example etchant that selectively etches layer 114 may include vapor phased HCl at a suitable temperature and pressure.

FIGS. 3A, 3B, and 3C depict the IC 100 after spacer deposition. Dielectric material is formed as gate spacer material 302 in the cavity 202 and on the sacrificial gate structure 120, the hard mask layer 122, and the nanosheet stack 150. A horizontal layer of the gate spacer material 302 isolates layers 110, 112 below from layers 110, 112 above. Example materials of the gate spacer material 302 may include SiN, SiBCN, SiOCN, SiOC, etc.

Figures 4A, 4B:
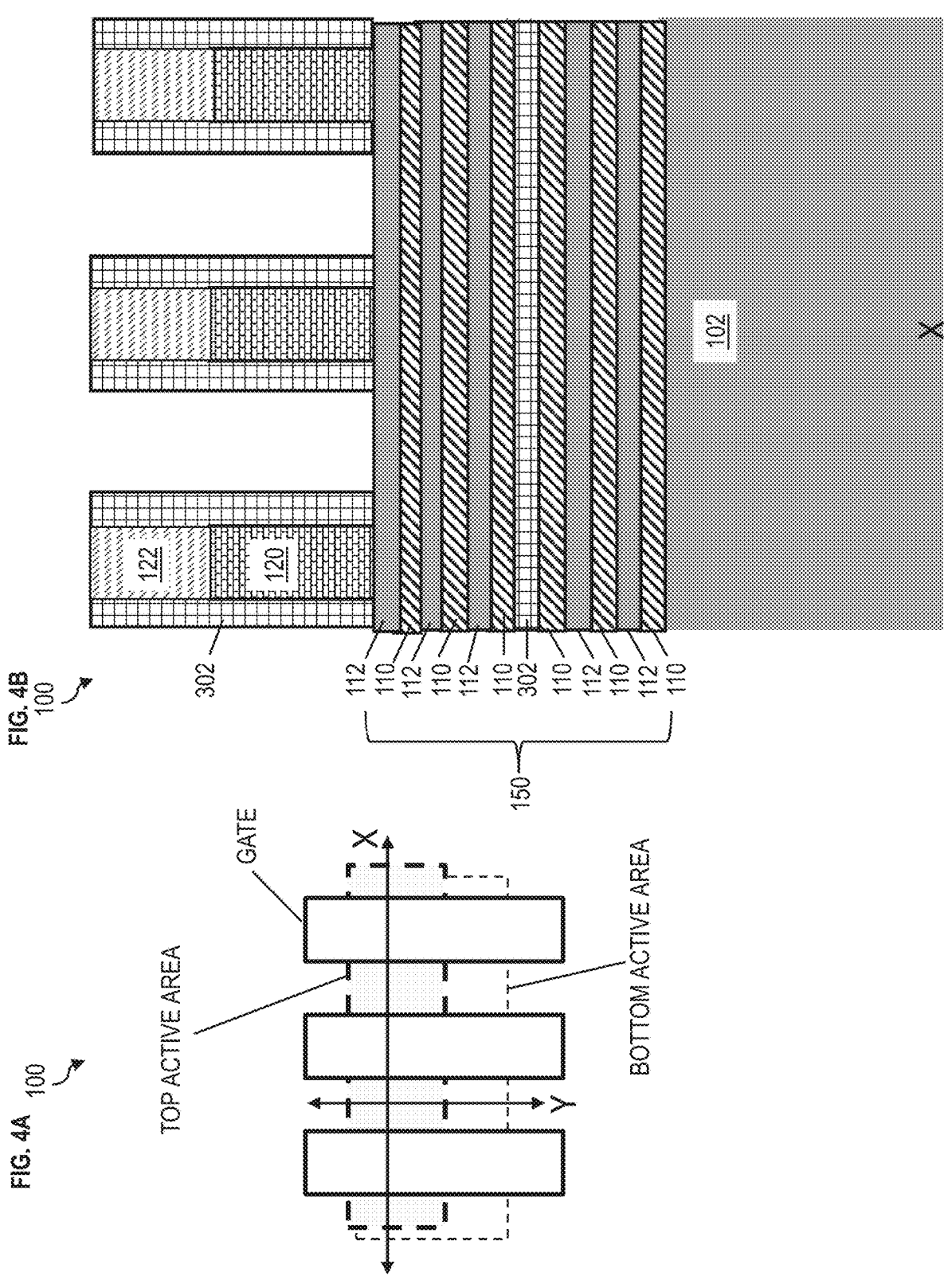
FIGS. 4A, 4B, and 4C respectively depict a top view and cross-sectional views of a portion of an IC under-fabrication after fabrication operations according to one or more embodiments of the invention.
Figure 4C:
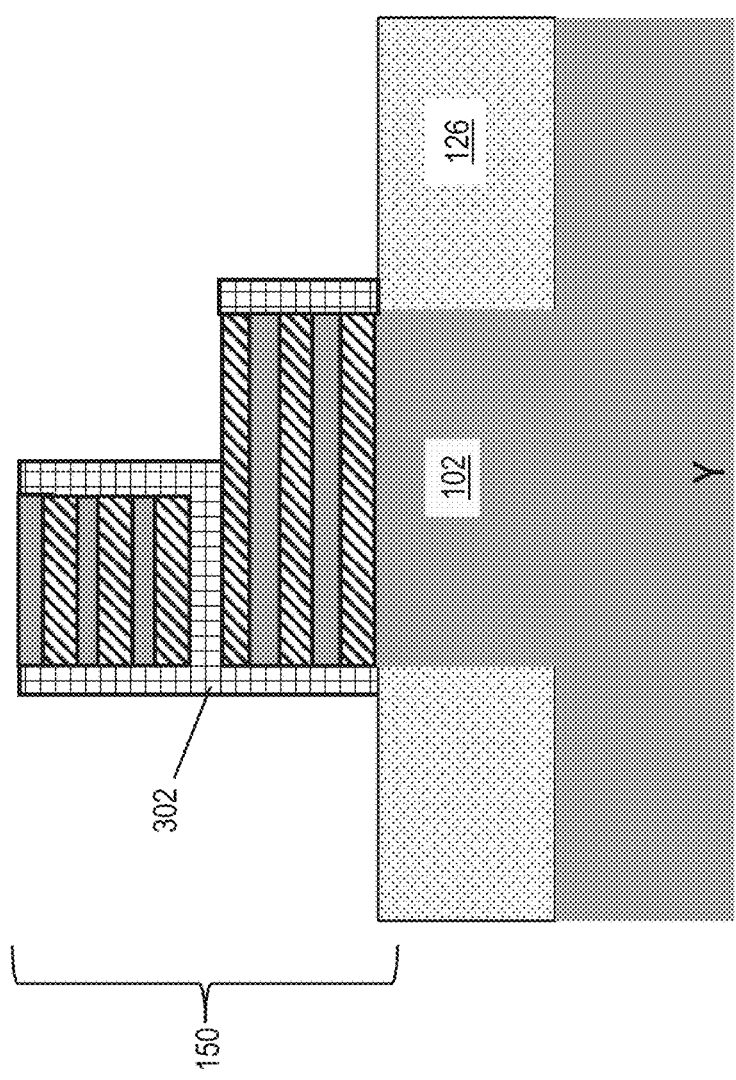

FIGS. 4A, 4B, and 4C depict the IC 100 after spacer etch back. An etch, for example, reactive ion etch (RIE), is performed to remove portions of the gate spacer material 302.

Figure 5C:
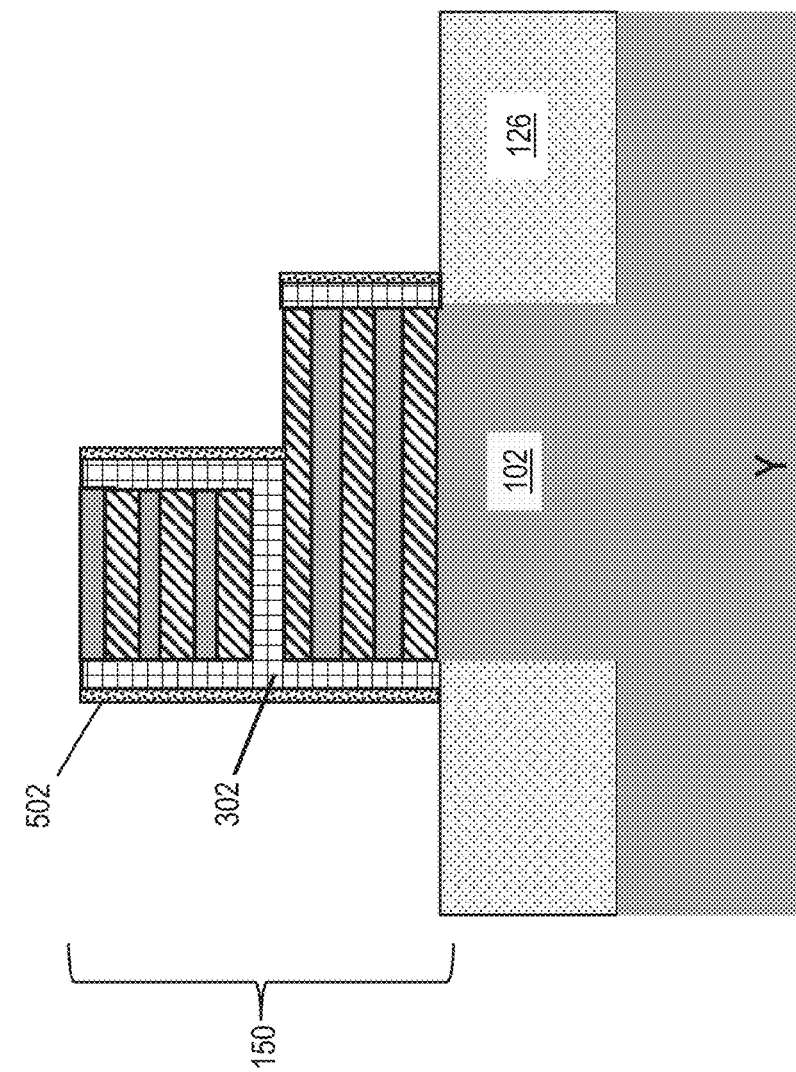

FIGS. 5A, 5B, and 5C depict the IC 100 after oxide spacer deposition. A liner 502 is formed on the sides of the gate spacer material 302. The liner 502 can be an oxide liner, such as silicon dioxide, etc.

Figure 6C:
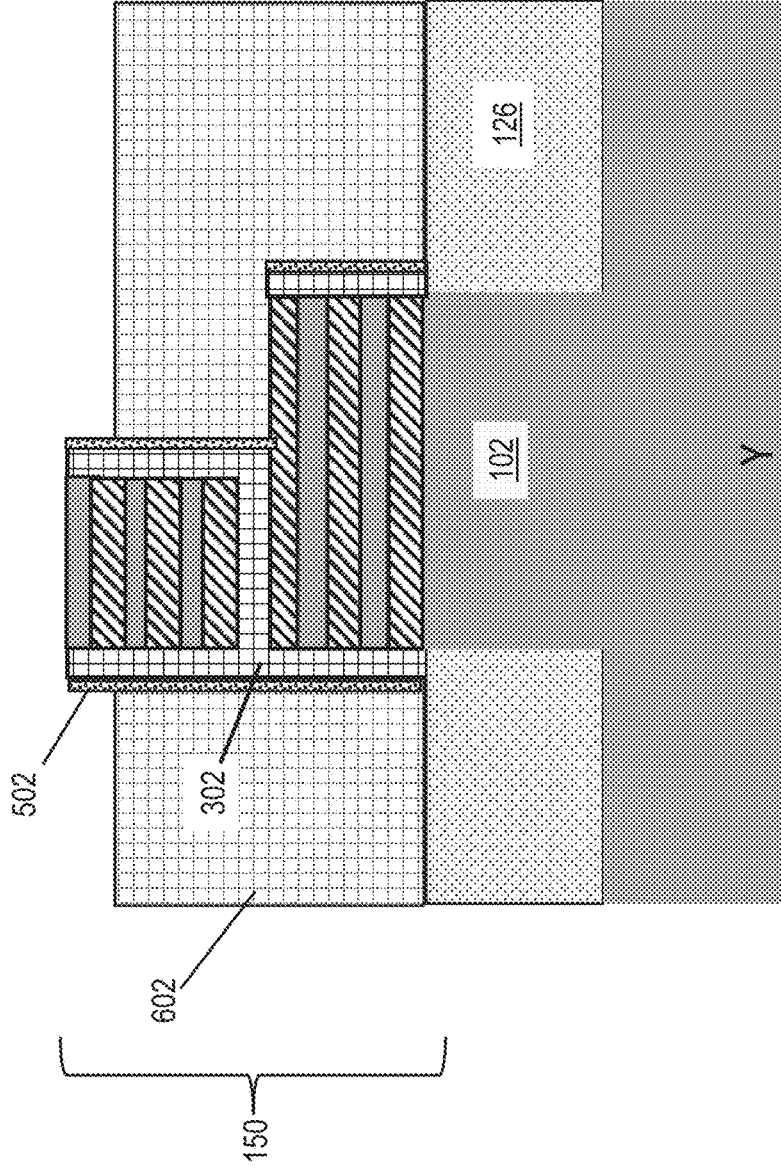

FIGS. 6A, 6B, and 6C depict the IC 100 after mask fill and recess. A mask layer 602 is deposited and etched. The mask layer 602 may be an organic patterning layer (OPL) and/or any suitable material or combination of materials. An anisotropic etch may be utilized to recess the mask layer 602.

Figures 7A, 7B:
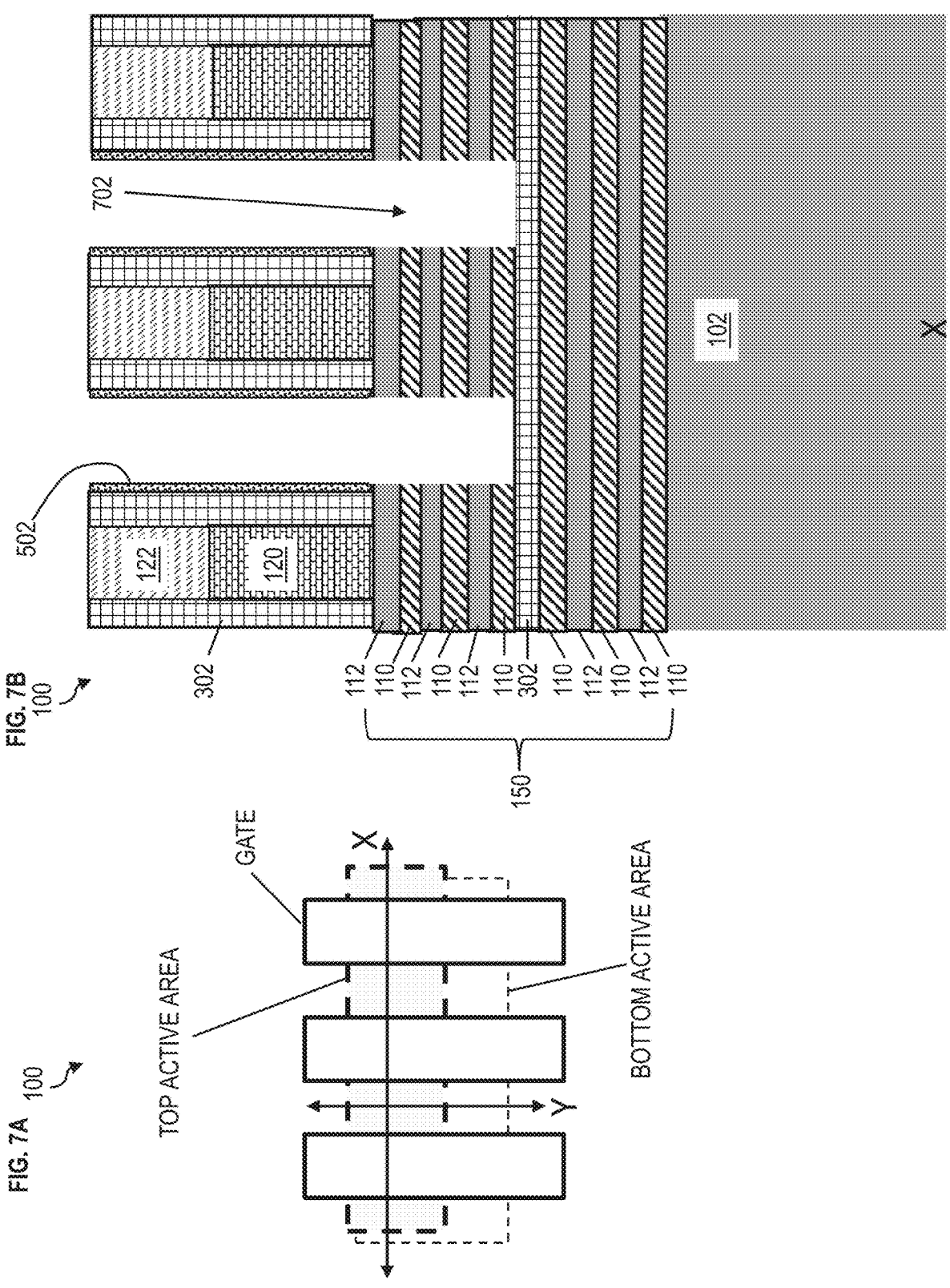
FIGS. 7A, 7B, and 7C respectively depict a top view and cross-sectional views of a portion of an IC under-fabrication after fabrication operations according to one or more embodiments of the invention.
Figure 7C:
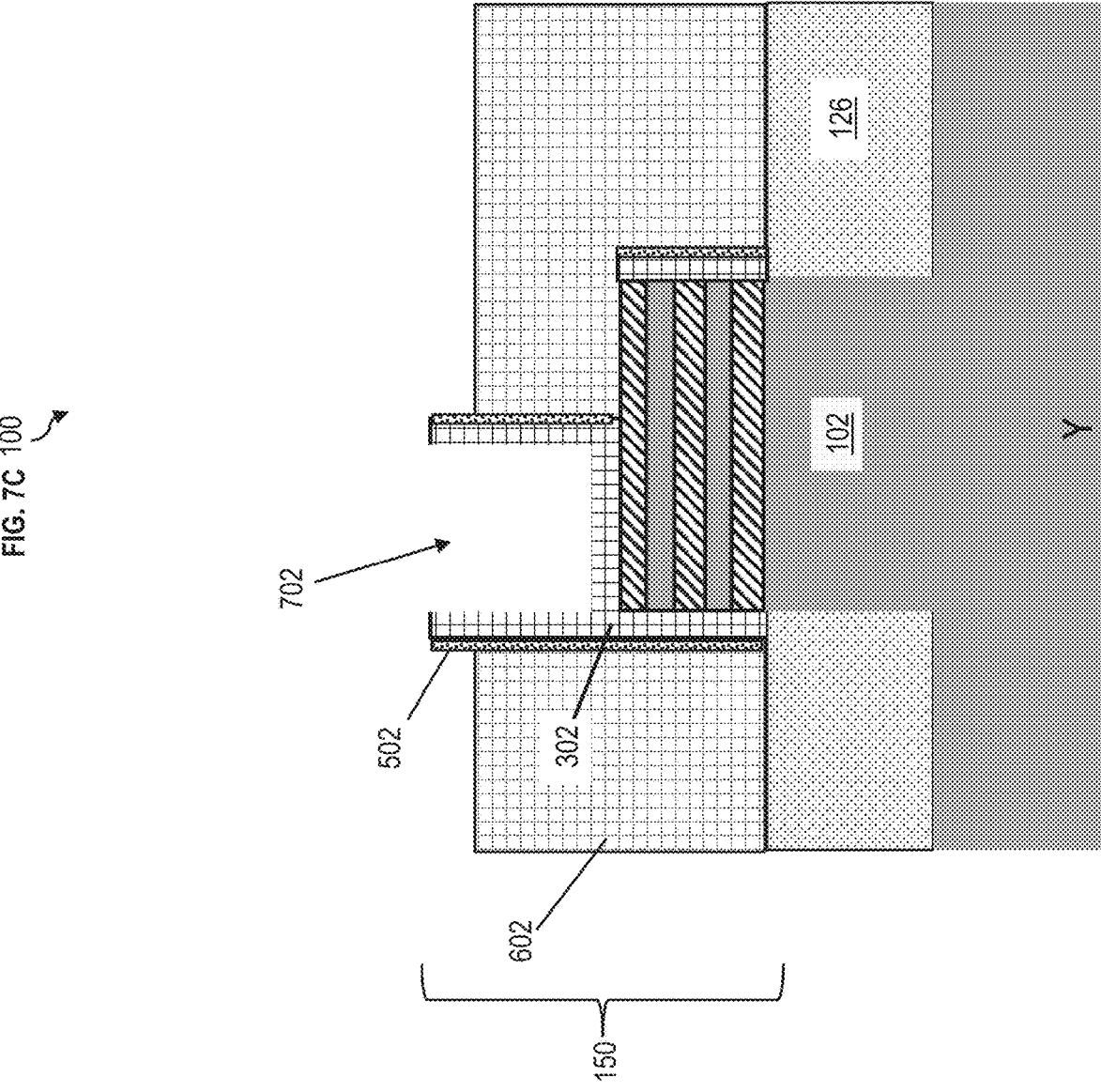

FIGS. 7A, 7B, and 7C depict the IC 100 after top active region recess. Using the patterned mask layer 602 as a mask to protect bottom active region, etching is performed to pattern exposed portions of the nanosheet stack 150. Accordingly, etching is performed through layers 110, 112 stopping on the gate spacer material 302, resulting in cavities 702.

Figure 8C:
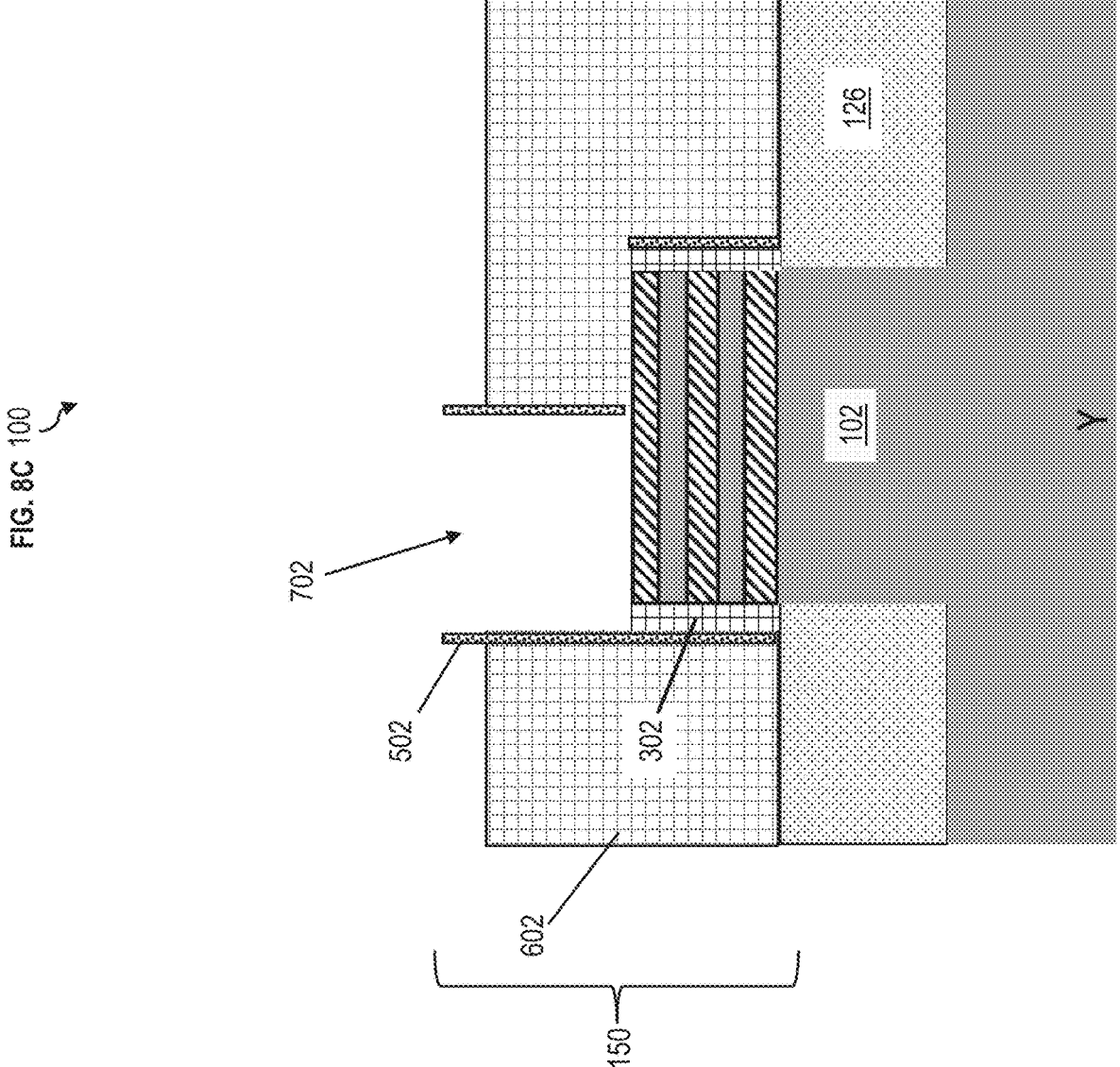

FIGS. 8A, 8B, and 8C depict the IC 100 after etching. Using the patterned mask layer 602 as a mask, etching is performed to pattern exposed portions of the gate spacer material 302. Accordingly, the gate spacer material 302 is selectively recessed, thereby exposing lower layers 110, 112 below the horizontal gate spacer material 302. Any suitable wet or dry etch can be used to selectively remove nitride.

Figure 9C:
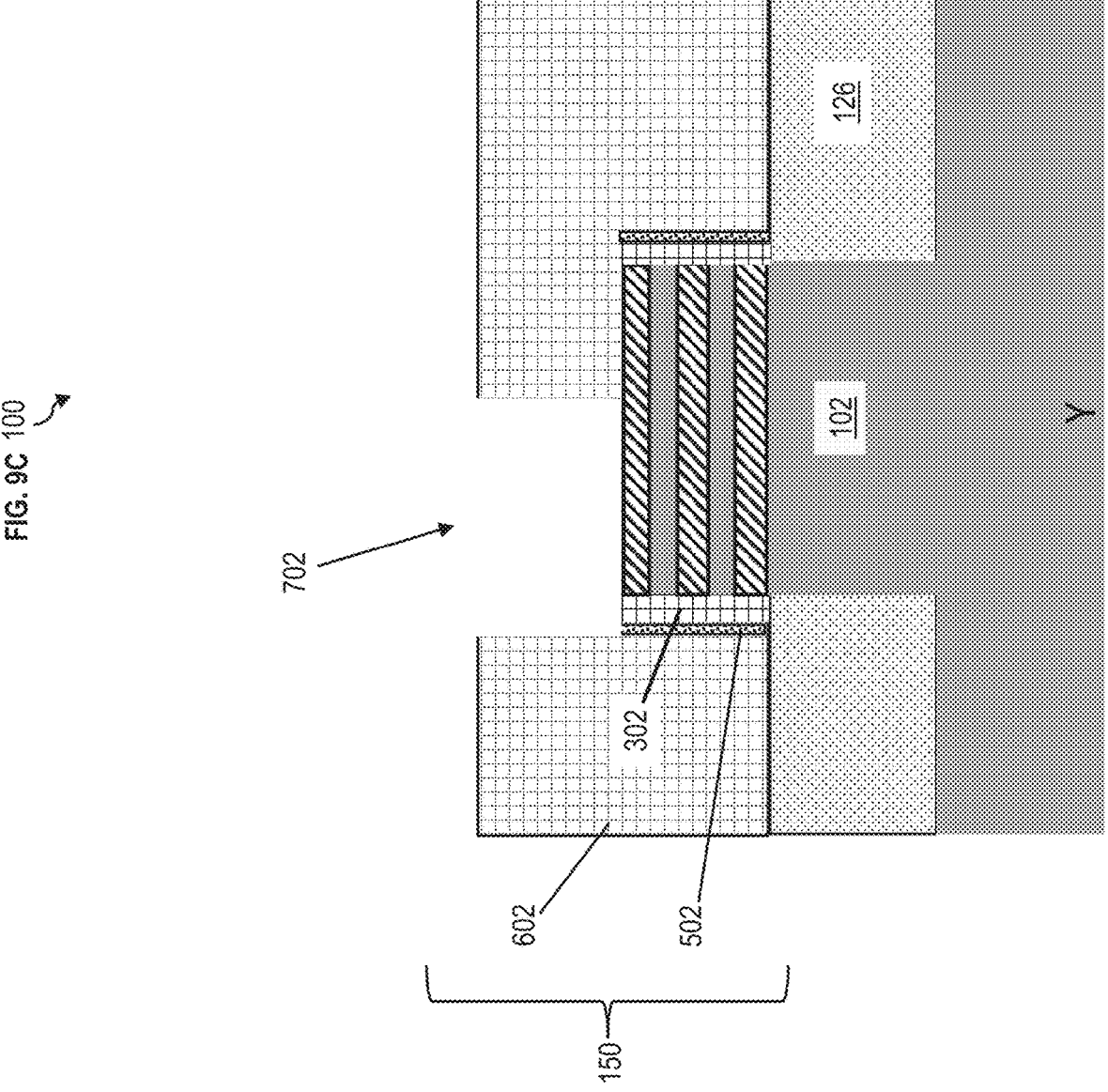

FIGS. 9A, 9B, and 9C depict the IC 100 after etching the liner 502. Exposed portions of the liner 502 are removed. Any suitable wet or dry etch can be utilized that selectively removes oxide, for example, silicon dioxide.

Figure 10C:
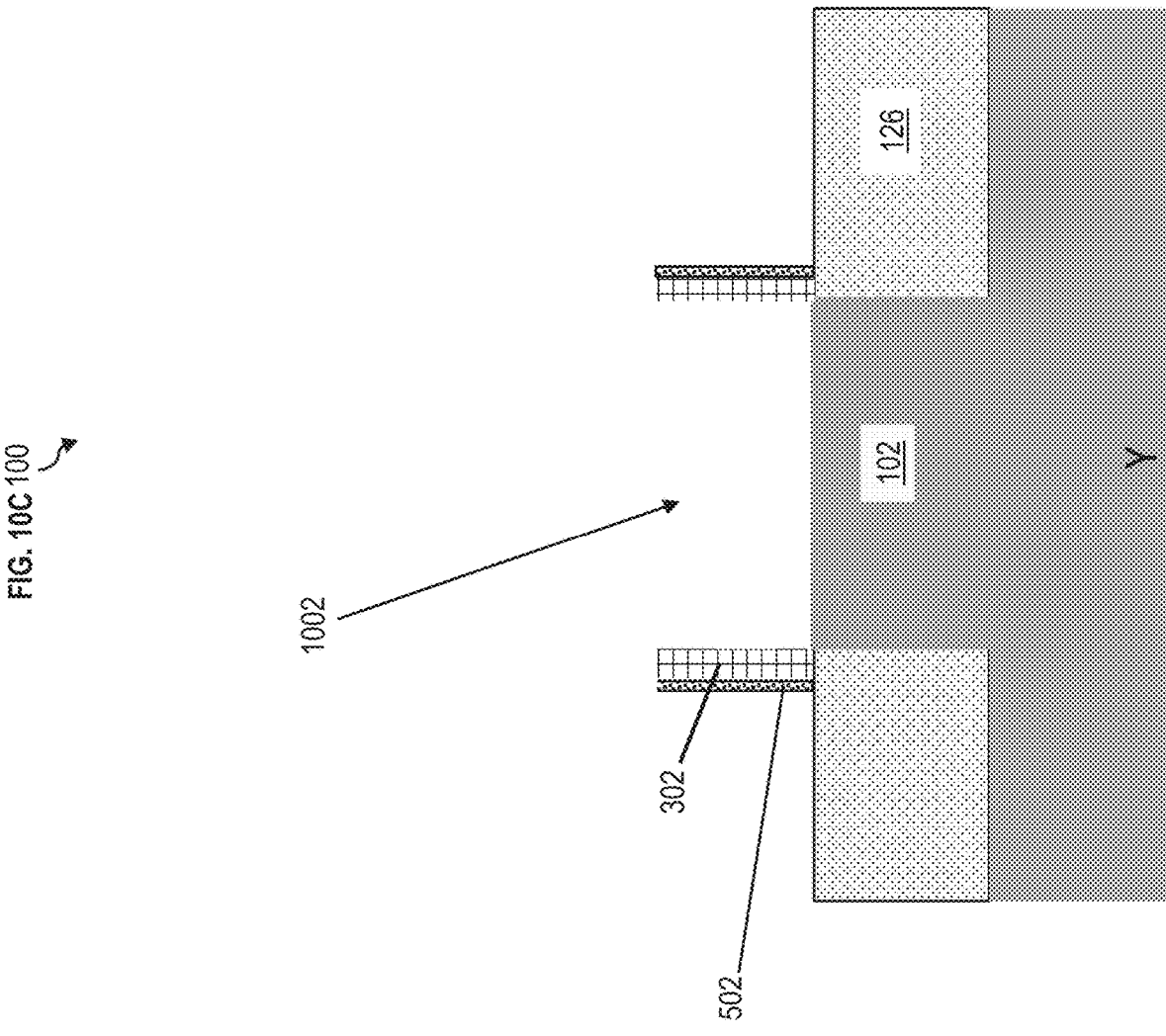

FIGS. 10A, 10B, and 10C depict the IC 100 after SiGe indention and subsequent inner spacer formation. The mask layer 602 is removed, for example, using an OPL ash. The bottom active region is etched. Accordingly, etching is performed through layers 110, 112 stopping on the substrate 102, resulting in cavities 1002. Further, an isotropic etch process is performed to selectively recess the layers 110 in order to define end cavities on ends thereof. A conformal deposition process, such as an ALD process, is performed to form a layer of inner spacer material on the nanosheet stacks 150, and the inner spacer material is isotropically etched to define inner spacers 1004 in the end cavities. Example materials of the inner spacers 1004 may include SiBCN, SiOCN, SiN, SiOC, SiC, etc.

Figures 11A, 11B:
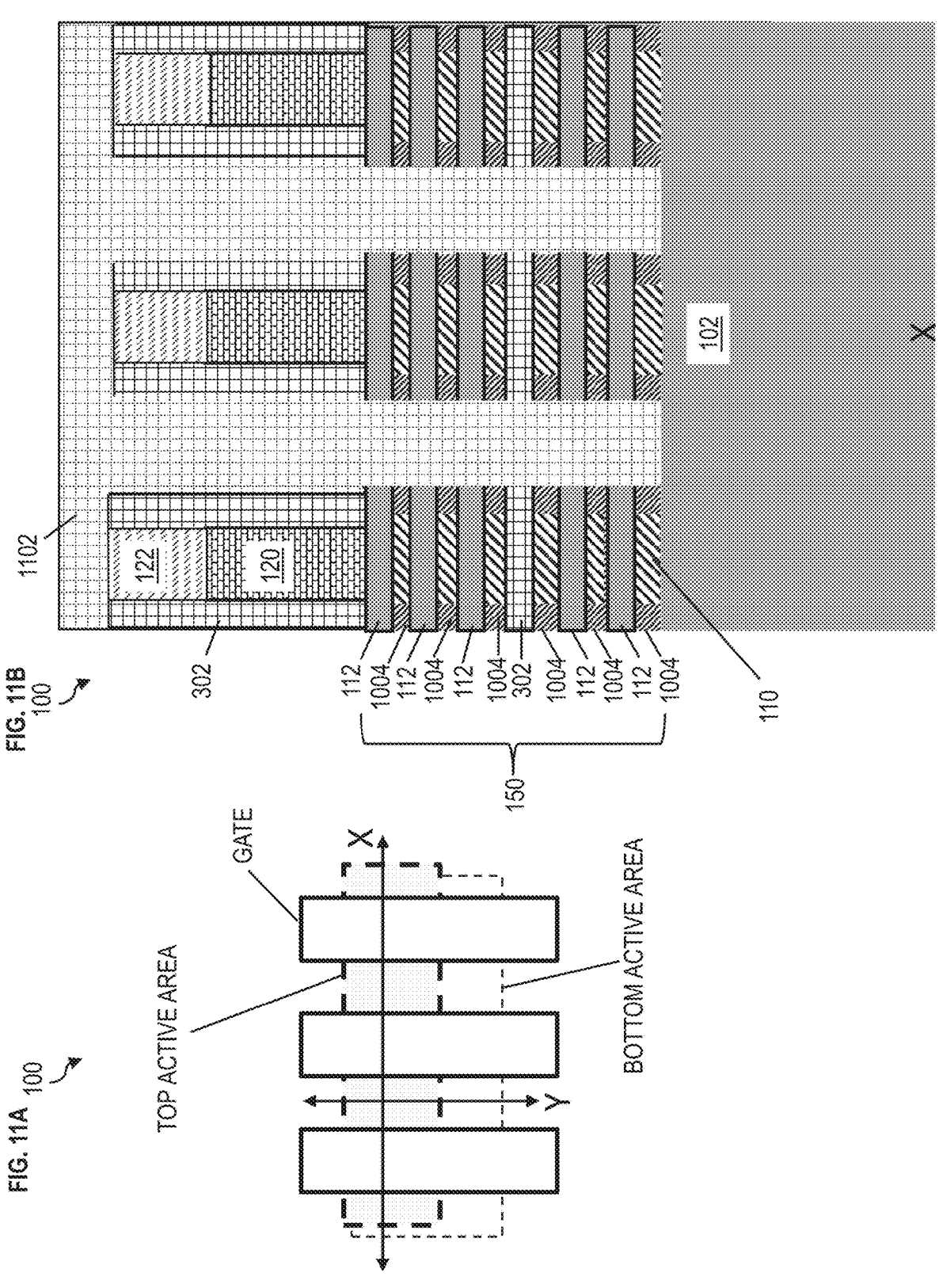
FIGS. 11A, 11B, and 11C respectively depict a top view and cross-sectional views of a portion of an IC under-fabrication after fabrication operations according to one or more embodiments of the invention.
Figure 11C:
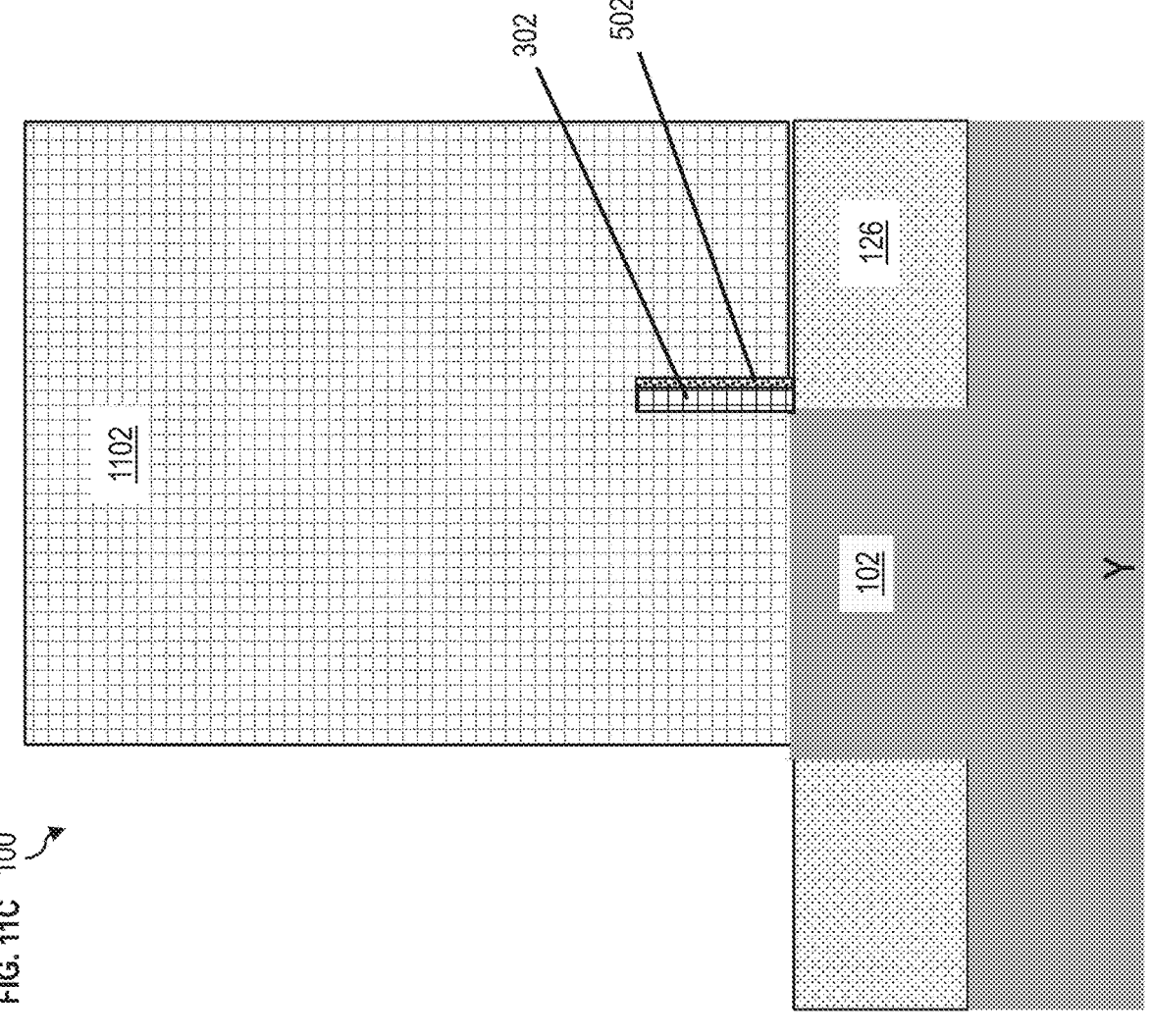

FIGS. 11A, 11B, and 11C depict the IC 100 after the removal of the fang spacer from one side of the bottom source/drain epitaxial region. Another mask layer 1102 is formed and patterned such that one side of the gate spacer material 302 is exposed while the other side of the gate spacer material 302 is exposed. The exposed gate spacer material 302 (i.e., fang spacer) and liner 502 are removed, in preparation for bottom epitaxial growth.

Figures 12A, 12B:
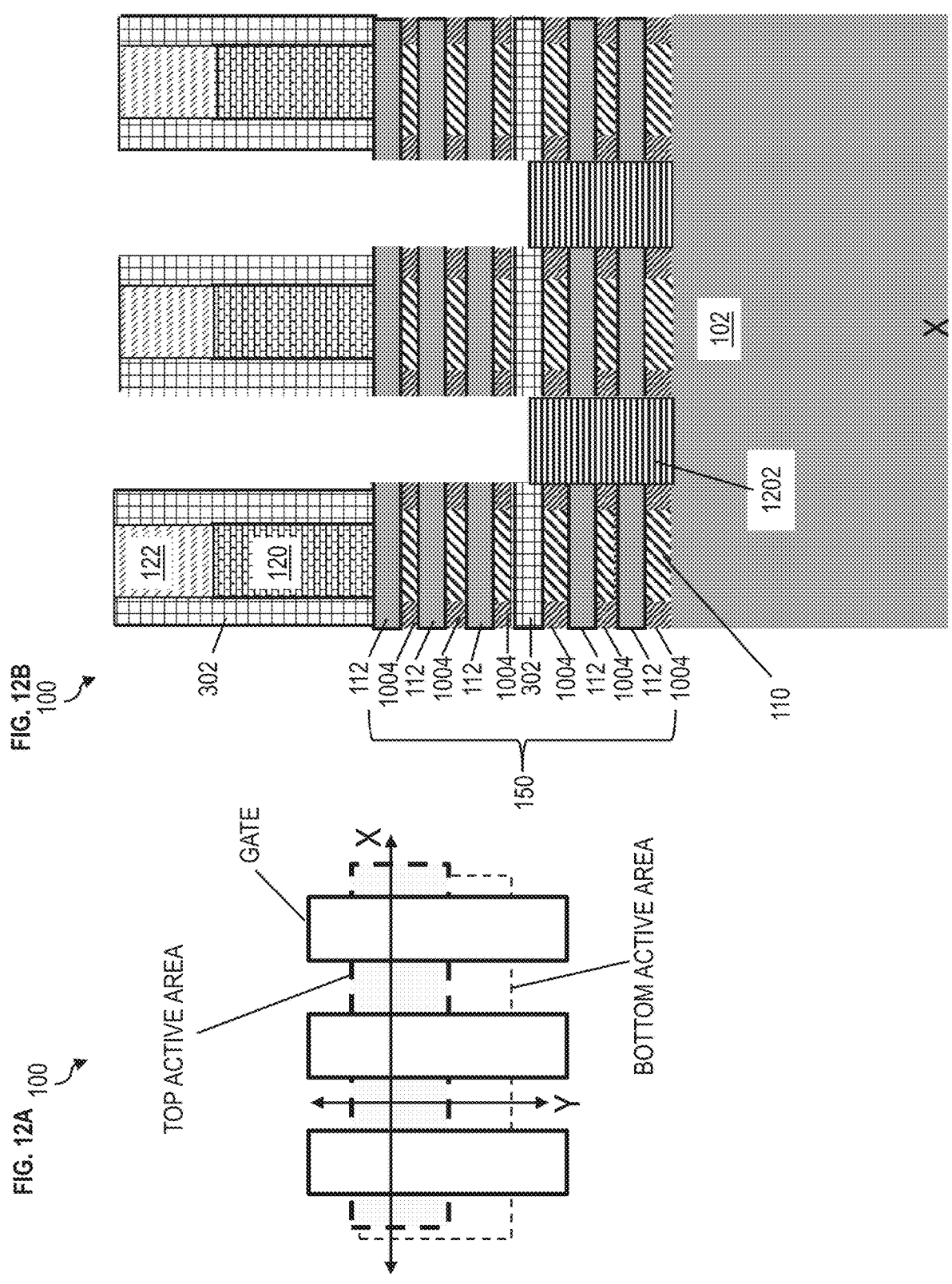
FIGS. 12A, 12B, and 12C respectively depict a top view and cross-sectional views of a portion of an IC under-fabrication after fabrication operations according to one or more embodiments of the invention.
Figure 12C:
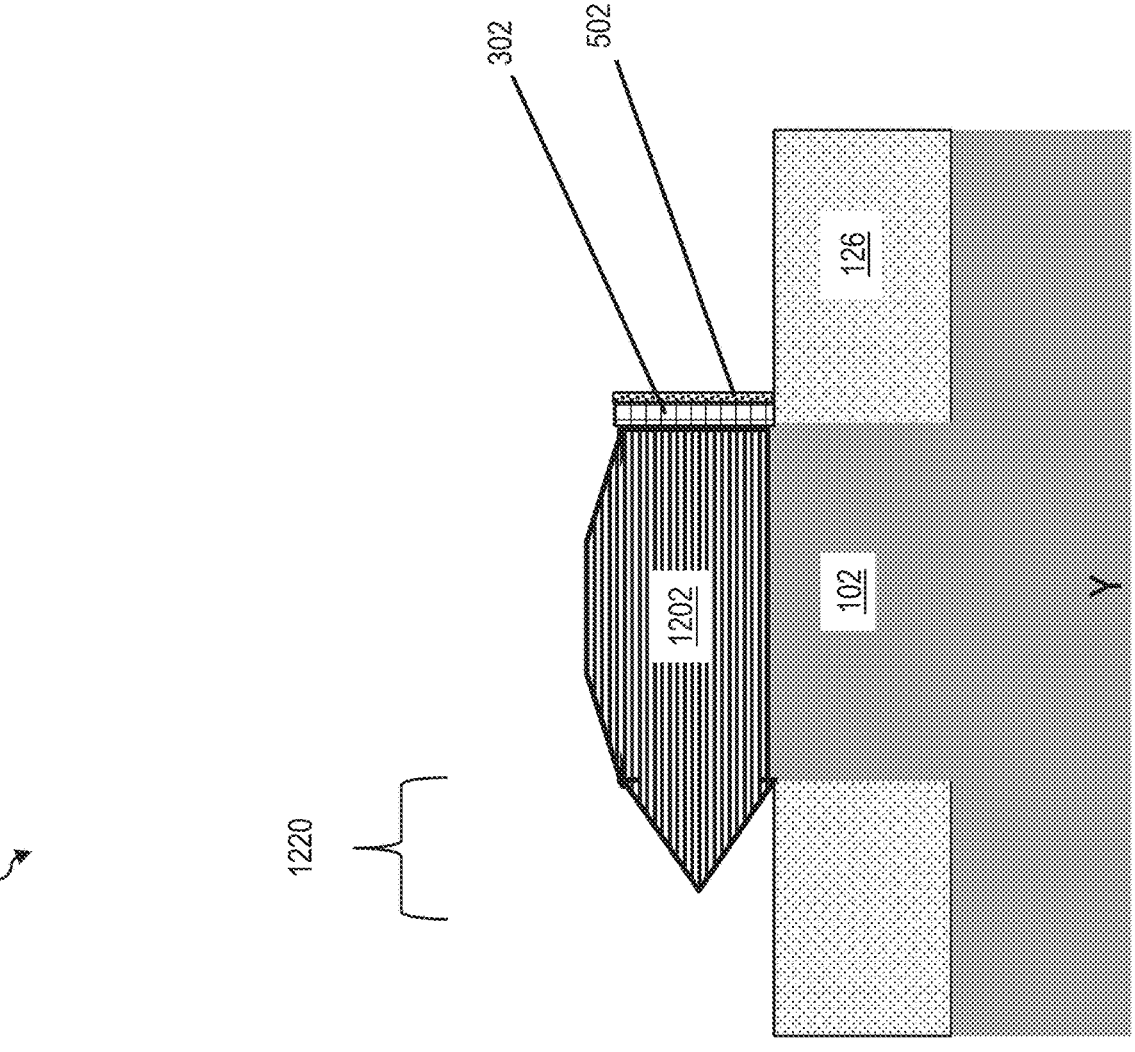

FIGS. 12A, 12B, and 12C depict the IC 100 after bottom source and drain formation. The bottom source/drain epitaxial regions 1202 are grown. One side of the bottom source/drain epitaxial regions 1202 abuts the gate spacer material 302, while the other side grows the horizontal protrusion 1220 unconfined from any gate spacer material 302. The bottom source/drain epitaxial regions 1202 (and the top source/drain epitaxial regions 1304 depicted in FIGS. 13A, 13B, and 13C) can be P-type epitaxial material, resulting in P-type source and drain regions or can be N-type epitaxial material, resulting in N-type source and drain regions. The bottom source/drain epitaxial regions 1202 and the top source/drain epitaxial regions 1304 can be the same type or complementary.

Figures 13A, 13B:
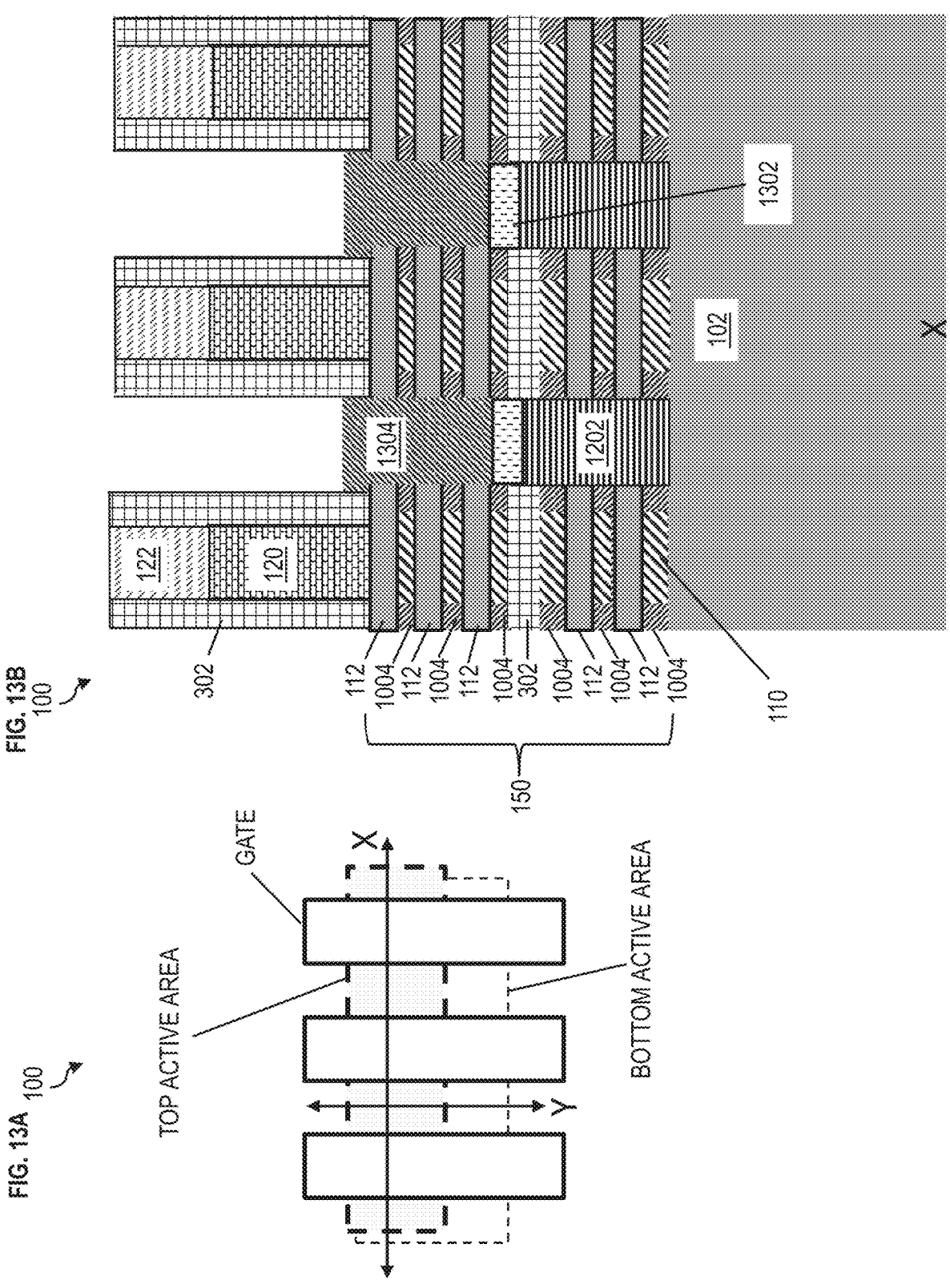
FIGS. 13A, 13B, and 13C respectively depict a top view and cross-sectional views of a portion of an IC under-fabrication after fabrication operations according to one or more embodiments of the invention.
Figure 13C:
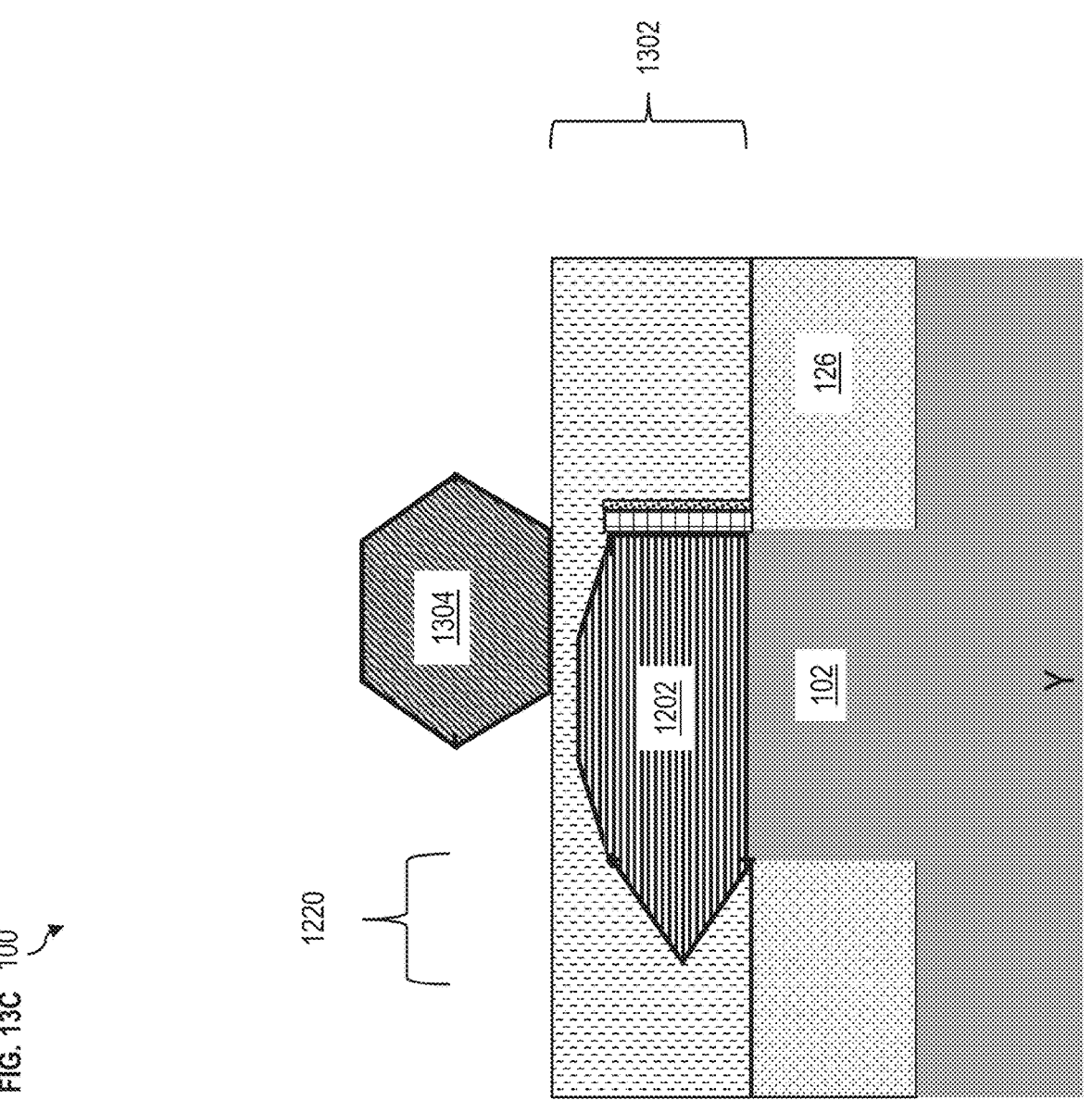

FIGS. 13A, 13B, and 13C depict the IC 100 after top source and drain formation. Interlayer dielectric (ILD) material 1302 is deposited. The top source/drain epitaxial regions 1304 are grown. The top source/drain epitaxial regions 1304 have a symmetric profile or shape. The bottom source/drain epitaxial regions 1202 have an asymmetric profile or shape with the horizontal protrusion 1220 that extends laterally in a direction parallel to the substrate 102 and extends beyond the edge of the top source/drain epitaxial regions 1202.

The ILD material 1302 can be a low-k dielectric material or an ultralow-k dielectric material. Low-k dielectric materials may generally include dielectric materials having a k value of about 3.9 or less, such as silicon dioxide. The ultralow-k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nano-foams, silica xerogels, porous hydrogen silsequioxane (HSQ), porous methylsilsesquioxane (MSQ), porous inorganic materials, porous CVD materials, porous organic materials, or combinations thereof. The ultralow-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide(s) such as tetraetehoxysilane (TEOS).

Figures 14A, 14B:
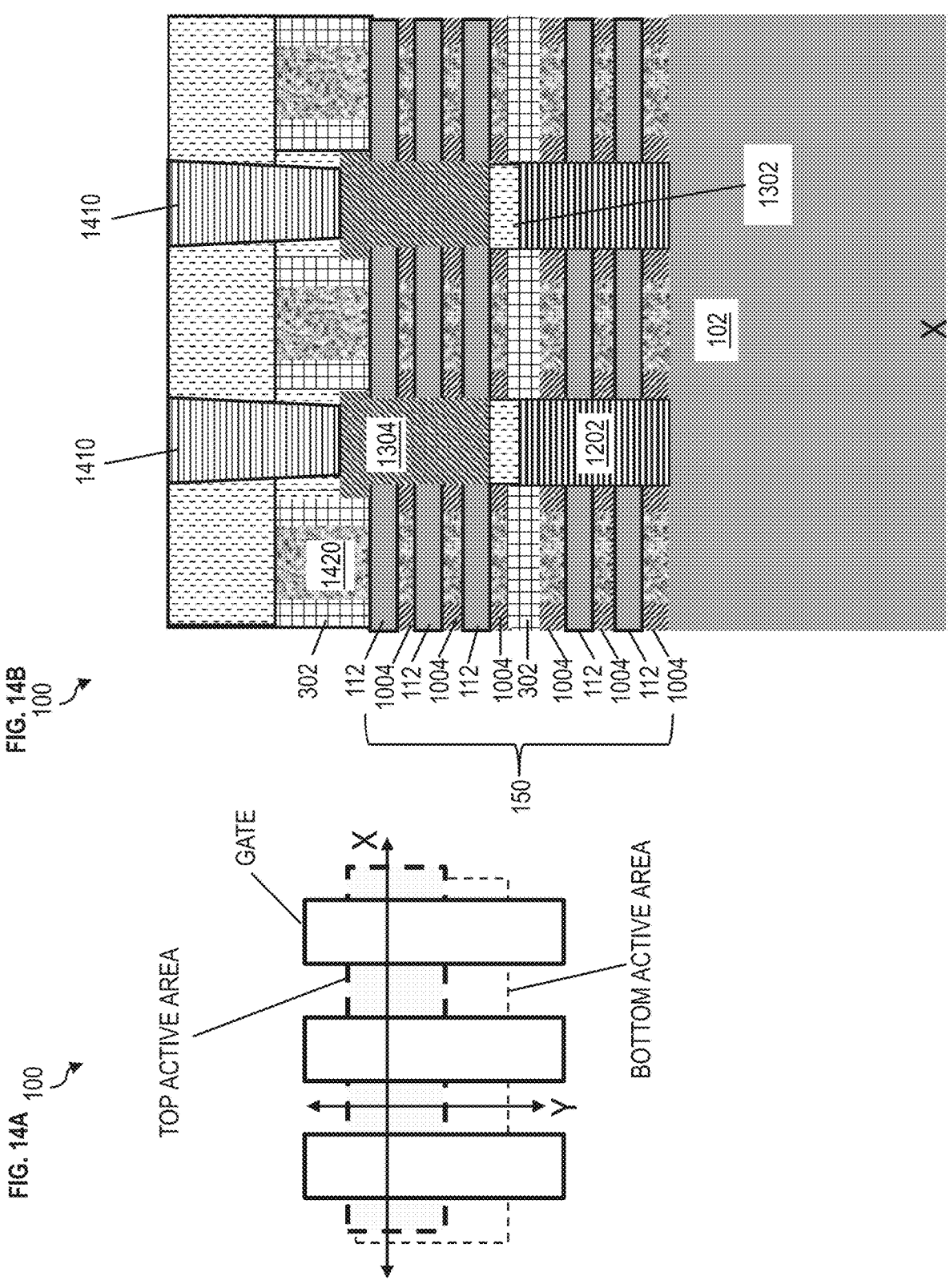
FIGS. 14A, 14B, and 14C respectively depict a top view and cross-sectional views of a portion of an IC under-fabrication after fabrication operations according to one or more embodiments of the invention.
Figure 14C:
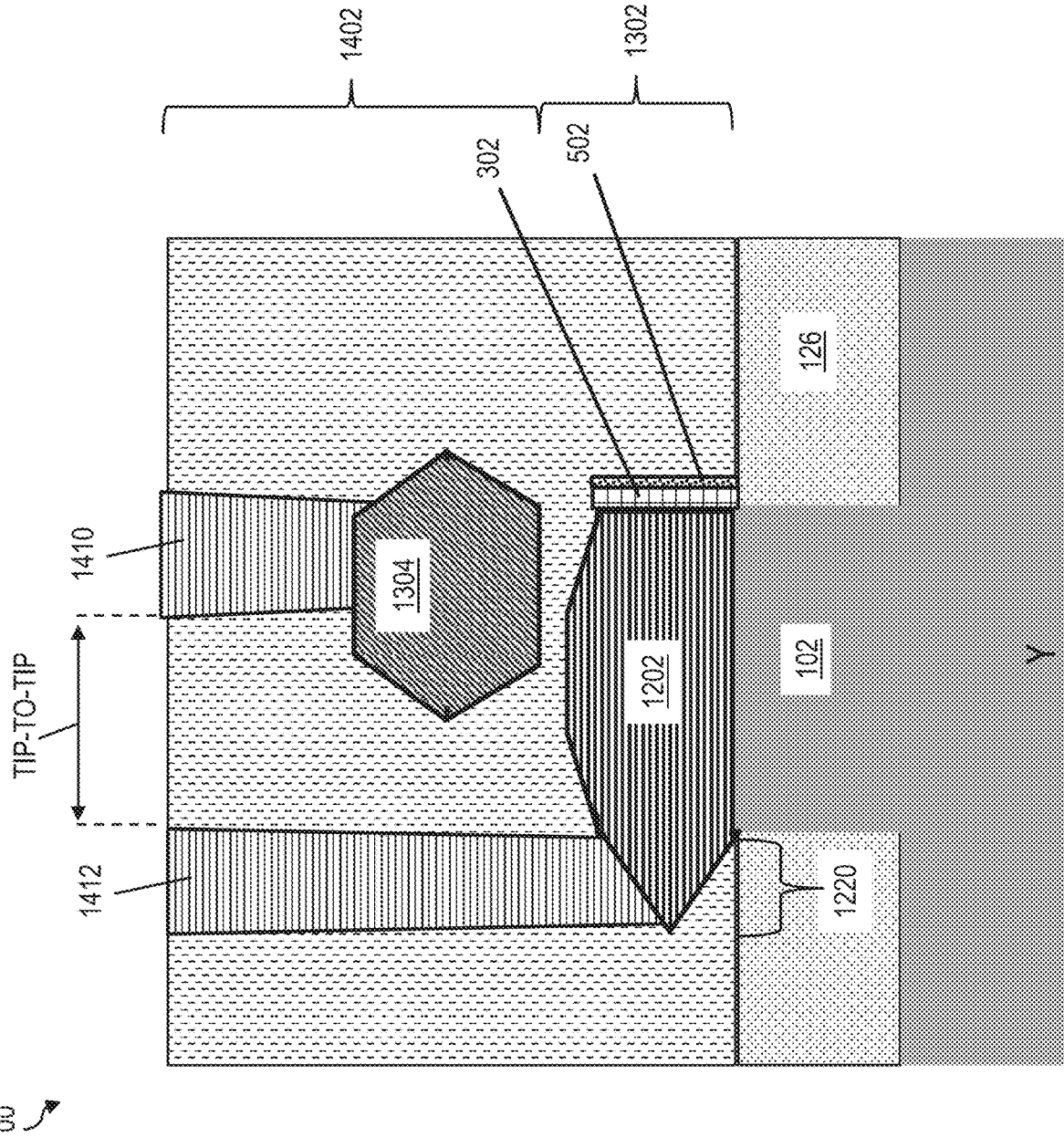

FIGS. 14A, 14B, and 14C depict the IC 100 after dummy gate removal. The gate hard mask layer 122 is removed, and chemical mechanical planarization/polishing (CMP) is performed. The sacrificial gate structures 120 are removed, and the sacrificial layers 110 (SiGe) are released. Replacement metal gate (RMG) formation is performed, thereby forming gate regions 1420. The replacement metal gate process is performed to deposit a high-k dielectric material followed by one or more work function material layers to thereby form the gate regions 1420. ILD material 1402 is deposited. The dielectric material used for ILD material 1302 and/or ILD material 1402 can be a low-k dielectric material or an ultralow-low k dielectric material.

Contact formation is performed for middle-of-the-line (MOL) contacts, resulting in metal contacts 1410 and 1412. For example, cavities are formed, and then metal is deposited to fill the cavities thereby forming the metal contacts 1410 and 1412. A portion of the metal contacts may include silicide, resulting from the interface of the metal material and semiconductor material. As seen in FIG. 14C, the tip-to-tip distance between source/drain metal contacts 1410 and 1412 is increased because the metal contact 1412 is formed on the horizontal protrusion 1220. This beneficially avoids a short circuit between the metal contacts 1410 and 1412. Additionally, because the metal contact 1412 is formed on the horizontal protrusion 1220, the increased tip-to-tip distance prevents an accidental short circuit between metal contact 1412 and the substrate 102 underneath in a case where the bottom source/drain epitaxial region 1202 is shifted or out of alignment.

Although examples illustrate a single top transistor above a single bottom transistor, it should be appreciated that an IC has numerous PFETs and NFETs. There can be hundreds, thousands, millions, or billions of transistors in an IC, having respective metal contacts.

Figure 15:
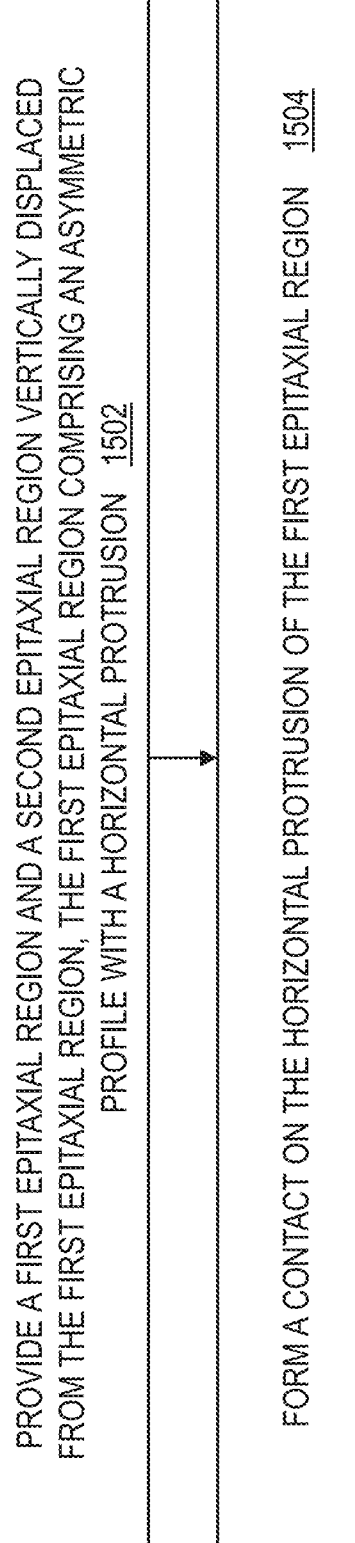
FIG. 15 is a flowchart of a computer-implemented method of forming a spacer cut for an asymmetric source/drain epitaxial structure in a stacked field-effect transistor (FET) according to one or more embodiments of the invention.

FIG. 15 is a flowchart of a computer-implemented method 1500 for a fang spacer cut for an asymmetric source/drain epitaxial structure in a stacked field-effect transistor (FET) according to one or more embodiments. Reference can be made to any of the figures discussed herein. At block 1502, the method 1500 includes providing a first epitaxial region (e.g., bottom source/drain epitaxial region 1202) and a second epitaxial region (e.g., top source/drain epitaxial region 1304) vertically displaced from the first epitaxial region, the first epitaxial region comprising an asymmetric profile with a horizontal protrusion (e.g., horizontal protrusion 1220). At block 1504, the method 1500 includes forming a contact on the horizontal protrusion (e.g., metal contact 1412 formed on the horizontal protrusion 1220) of the first epitaxial region.

Further, a stack (e.g., nanosheet stack 150) comprises the first epitaxial region (e.g., bottom source/drain epitaxial regions 1202) and the second epitaxial region (e.g., top source/drain epitaxial regions 1304). A first transistor comprises the first epitaxial region and a second transistor comprises the second epitaxial region, the first and second transistors being vertically stacked. Spacer material (e.g., gate spacer material 302) confines one side of the first epitaxial region, the horizontal protrusion being opposite the one side and free of confinement by the spacer material.

One side of the first epitaxial region is flat and is opposite the horizontal protrusion, for example, as depicted in FIG. 12C. The second epitaxial region comprises a symmetric profile. The contact formed on the horizontal protrusion of the first epitaxial region is physically and laterally separated another contact formed on the second epitaxial region, for example, as depicted in FIG. 14C. The horizontal protrusion extends beyond an edge of the second epitaxial region, for example, as depicted in FIGS. 13C and 14C. The first epitaxial region is below the second epitaxial region. The first epitaxial region is epitaxially grown with the horizontal protrusion.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfurization of the metal such as copper to form a metal sulfide, e.g., $Cu_2S$, followed by selective wet etching of the metal sulfide, e.g., etching of $Cu_2S$ in HCl.

Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
   a first epitaxial region and a second epitaxial region vertically displaced from the first epitaxial region, the first epitaxial region comprising an asymmetric profile with a horizontal protrusion, wherein a spacer material confines one side of the first epitaxial region and is formed on a portion of a shallow trench isolation (STI) region, an entirety of a top surface of the first epitaxial region being free of the spacer material; and
   a contact formed on the horizontal protrusion of the first epitaxial region, wherein the horizontal protrusion is opposite the one side and free of confinement by the spacer material, wherein an interlayer dielectric material abuts the top surface of the first epitaxial region, wherein the horizontal protrusion extends beyond an edge of the second epitaxial region.

2. The semiconductor structure of claim 1, wherein a stack comprises the first epitaxial region and the second epitaxial region.

3. The semiconductor structure of claim 1, wherein a first transistor comprises the first epitaxial region and a second transistor comprises the second epitaxial region, the first and second transistors being vertically stacked.

4. The semiconductor structure of claim 1, wherein one side of the first epitaxial region is flat and is opposite the horizontal protrusion.

5. The semiconductor structure of claim 1, wherein the second epitaxial region comprises a symmetric profile.

6. The semiconductor structure of claim 1, wherein the contact formed on the horizontal protrusion of the first epitaxial region is physically and laterally separated from another contact formed on the second epitaxial region.

7. The semiconductor structure of claim 1, wherein the first epitaxial region is below the second epitaxial region.

8. The semiconductor structure of claim 1, wherein the first epitaxial region is epitaxially grown with the horizontal protrusion.

9. The semiconductor structure of claim 1, wherein the one side extends from a top to a bottom of the first epitaxial region such that the spacer material is contact with the first epitaxial region from the top to the bottom, thereby preventing the first epitaxial region from extending beyond the spacer material.

10. The semiconductor structure of claim 1, wherein the spacer material confining the one side of the first epitaxial region is in contact with the STI region.

11. The semiconductor structure of claim 1, wherein the spacer material is a dielectric material.

12. A method comprising:
   providing a first epitaxial region and a second epitaxial region vertically displaced from the first epitaxial region, the first epitaxial region comprising an asymmetric profile with a horizontal protrusion, wherein a spacer material confines one side of the first epitaxial region and is formed on a portion of a shallow trench isolation (STI) region, an entirety of a top surface of the first epitaxial region being free of the spacer material; and
   forming a contact on the horizontal protrusion of the first epitaxial region, wherein the horizontal protrusion is opposite the one side and free of confinement by the spacer material, wherein an interlayer dielectric material abuts the top surface of the first epitaxial region, wherein the horizontal protrusion extends beyond an edge of the second epitaxial region.

13. The method of claim 12, wherein a stack comprises the first epitaxial region and the second epitaxial region.

14. The method of claim 12, wherein a first transistor comprises the first epitaxial region and a second transistor comprises the second epitaxial region, the first and second transistors being vertically stacked.

15. The method of claim 12, wherein one side of the first epitaxial region is flat and is opposite the horizontal protrusion.

16. The method of claim 12, wherein the second epitaxial region comprises a symmetric profile.

17. The method of claim 12, wherein the contact formed on the horizontal protrusion of the first epitaxial region is physically and laterally separated from another contact formed on the second epitaxial region.

18. The method of claim 12, wherein the first epitaxial region is below the second epitaxial region.

19. The method of claim 12, wherein the first epitaxial region is epitaxially grown with the horizontal protrusion.

\* \* \* \* \*